United States Patent
Ma et al.

(10) Patent No.: US 10,892,335 B2
(45) Date of Patent: Jan. 12, 2021

(54) DEVICE ISOLATION BY FIXED CHARGE

(71) Applicant: Intel Corporation, Santa Clara, CA (US)

(72) Inventors: Sean T. Ma, Portland, OR (US); Willy Rachmady, Beaverton, OR (US); Gilbert W. Dewey, Beaverton, OR (US); Aaron D. Lilak, Beaverton, OR (US); Justin R. Weber, Portland, OR (US); Harold W. Kennel, Portland, OR (US); Cheng-Ying Huang, Portland, OR (US); Matthew V. Metz, Portland, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 16/341,010

(22) PCT Filed: Dec. 1, 2016

(86) PCT No.: PCT/US2016/064298
§ 371 (c)(1),
(2) Date: Apr. 10, 2019

(87) PCT Pub. No.: WO2018/101941
PCT Pub. Date: Jun. 7, 2018

(65) Prior Publication Data
US 2020/0185501 A1    Jun. 11, 2020

(51) Int. Cl.
*H01L 29/40*    (2006.01)
*H01L 21/02*    (2006.01)
(Continued)

(52) U.S. Cl.
CPC ...... *H01L 29/408* (2013.01); *H01L 21/02271* (2013.01); *H01L 21/3115* (2013.01);
(Continued)

(58) Field of Classification Search
CPC ............... H01L 29/408; H01L 29/0649; H01L 29/0673; H01L 29/42392; H01L 29/66742;
(Continued)

(56) References Cited

U.S. PATENT DOCUMENTS

| 8,741,722 B2 * | 6/2014 | Chang ............... H01L 29/66545 257/365 |
| 2008/0157215 A1 * | 7/2008 | Miyashita ......... H01L 21/82384 257/374 |

(Continued)

FOREIGN PATENT DOCUMENTS

| WO | 2016105437 A1 | 6/2016 |
| WO | 2016179113 A1 | 11/2016 |

(Continued)

OTHER PUBLICATIONS

PCT International Search Report and Written Opinion for PCT Application No. PCT/US2016/064298 dated Aug. 28, 2017; 8 pages.

(Continued)

*Primary Examiner* — Mark W Tornow
(74) *Attorney, Agent, or Firm* — Patent Capital Group

(57) ABSTRACT

Disclosed herein are tri-gate and all-around-gate transistor arrangements, and related methods and devices. For example, in some embodiments, a transistor arrangement may include a channel material disposed over a substrate; a gate electrode of a first tri-gate or all-around-gate transistor, disposed over a first part of the channel material; and a gate electrode of a second tri-gate or all-around-gate transistor, (Continued)

disposed over a second part of the channel material. The transistor arrangement may further include a device isolation structure made of a fixed charge dielectric material disposed over a third part of the channel material, the third part being between the first part and the second part of the channel material.

20 Claims, 14 Drawing Sheets

(51) Int. Cl.
| | | |
|---|---|---|
| *H01L 21/3115* | (2006.01) | |
| *H01L 21/8234* | (2006.01) | |
| *H01L 27/088* | (2006.01) | |
| *H01L 29/06* | (2006.01) | |
| *H01L 29/423* | (2006.01) | |
| *H01L 29/66* | (2006.01) | |
| *H01L 29/78* | (2006.01) | |
| *H01L 29/786* | (2006.01) | |

(52) U.S. Cl.
CPC ........... *H01L 21/823412* (2013.01); *H01L 21/823431* (2013.01); *H01L 21/823481* (2013.01); *H01L 27/088* (2013.01); *H01L 29/0649* (2013.01); *H01L 29/0673* (2013.01); *H01L 29/42392* (2013.01); *H01L 29/66742* (2013.01); *H01L 29/66795* (2013.01); *H01L 29/7851* (2013.01); *H01L 29/78696* (2013.01)

(58) Field of Classification Search
CPC ........... H01L 29/66795; H01L 29/7851; H01L 29/78696; H01L 27/088; H01L 21/02271; H01L 21/3115; H01L 21/823412; H01L 21/823431; H01L 21/823481
See application file for complete search history.

(56) References Cited

U.S. PATENT DOCUMENTS

| | | |
|---|---|---|
| 2011/0186925 A1 | 8/2011 | Miyata |
| 2012/0205746 A1* | 8/2012 | Wang .................... H01L 27/088 257/368 |
| 2012/0214299 A1 | 8/2012 | Chudzik et al. |
| 2013/0119447 A1 | 5/2013 | Anderson et al. |
| 2016/0148947 A1 | 5/2016 | Seo et al. |
| 2016/0181161 A1 | 6/2016 | Song et al. |
| 2016/0254261 A1* | 9/2016 | Machkaoutsan .... H01L 27/0924 257/369 |
| 2016/0268371 A1 | 9/2016 | Okano |
| 2016/0329326 A1 | 11/2016 | Balakrishnan et al. |
| 2020/0044059 A1 | 2/2020 | Ma et al. |

FOREIGN PATENT DOCUMENTS

| | | |
|---|---|---|
| WO | 2018101941 A1 | 6/2018 |
| WO | 2018111250 A1 | 6/2018 |

OTHER PUBLICATIONS

PCT International Search Report and Written Opinion of PCT Application No. PCT/US2016/066436 dated Aug. 23, 2017; 7 pages.
PCT Patent Application No. PCT/US2016/066436 filed Dec. 14, 2016; 52 pages.

* cited by examiner

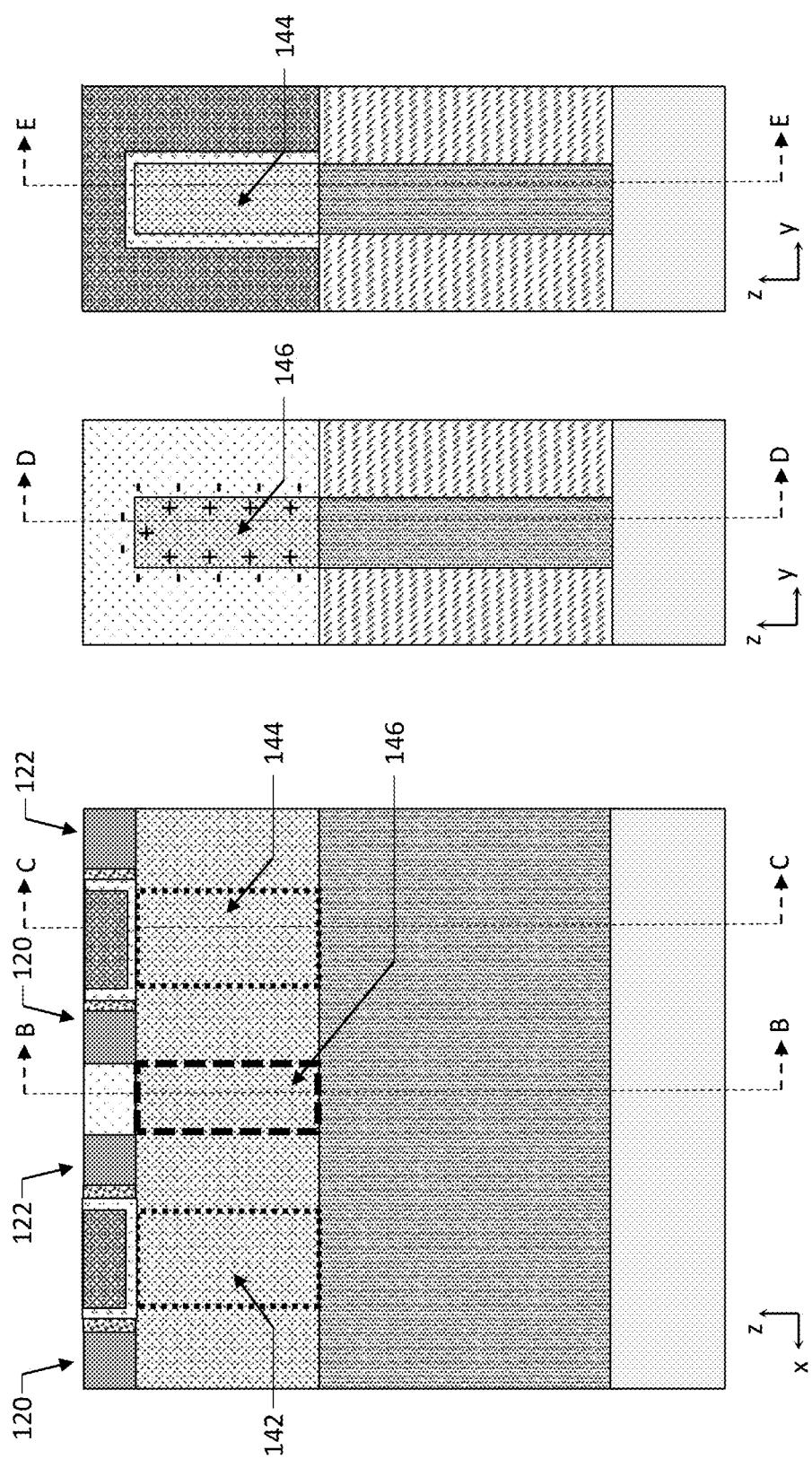

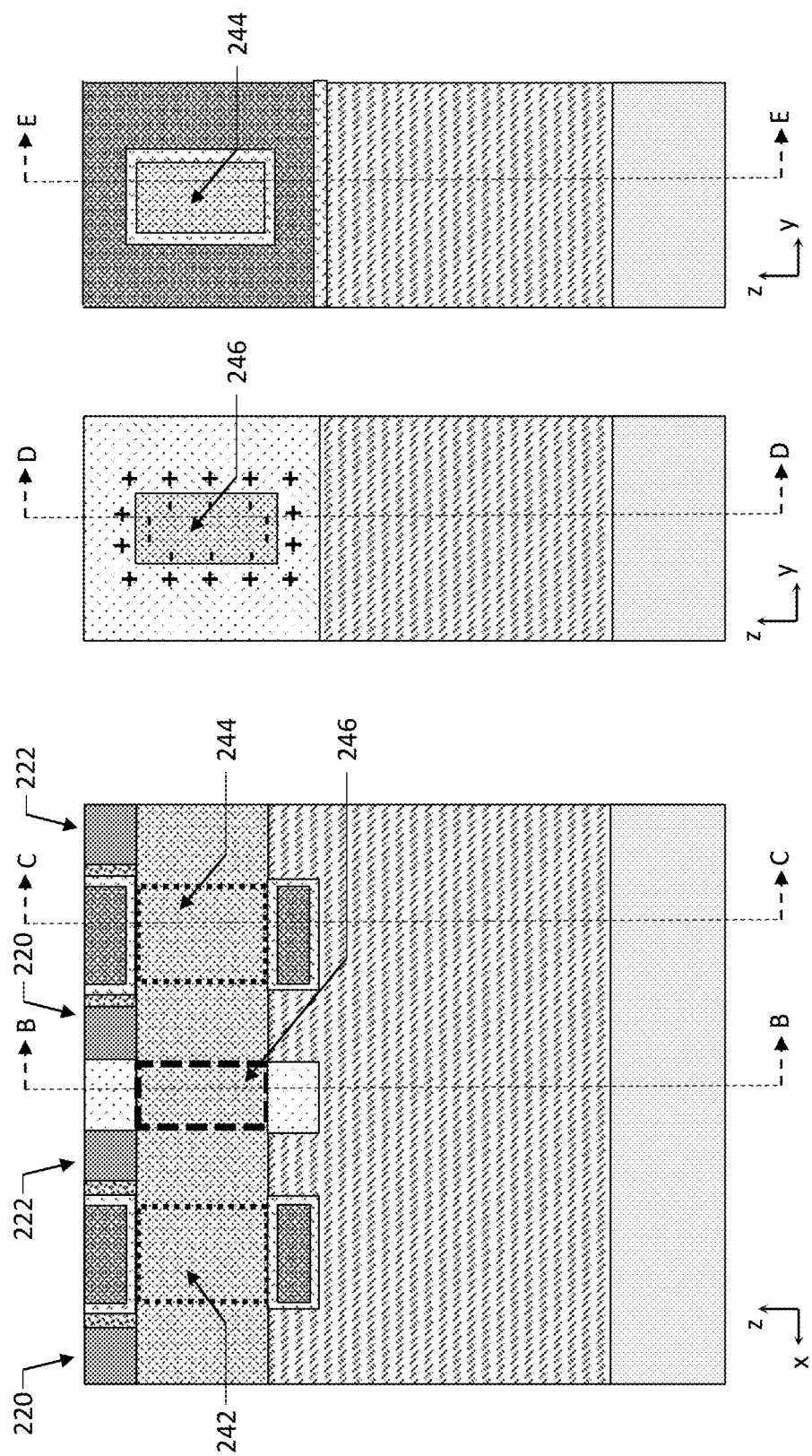

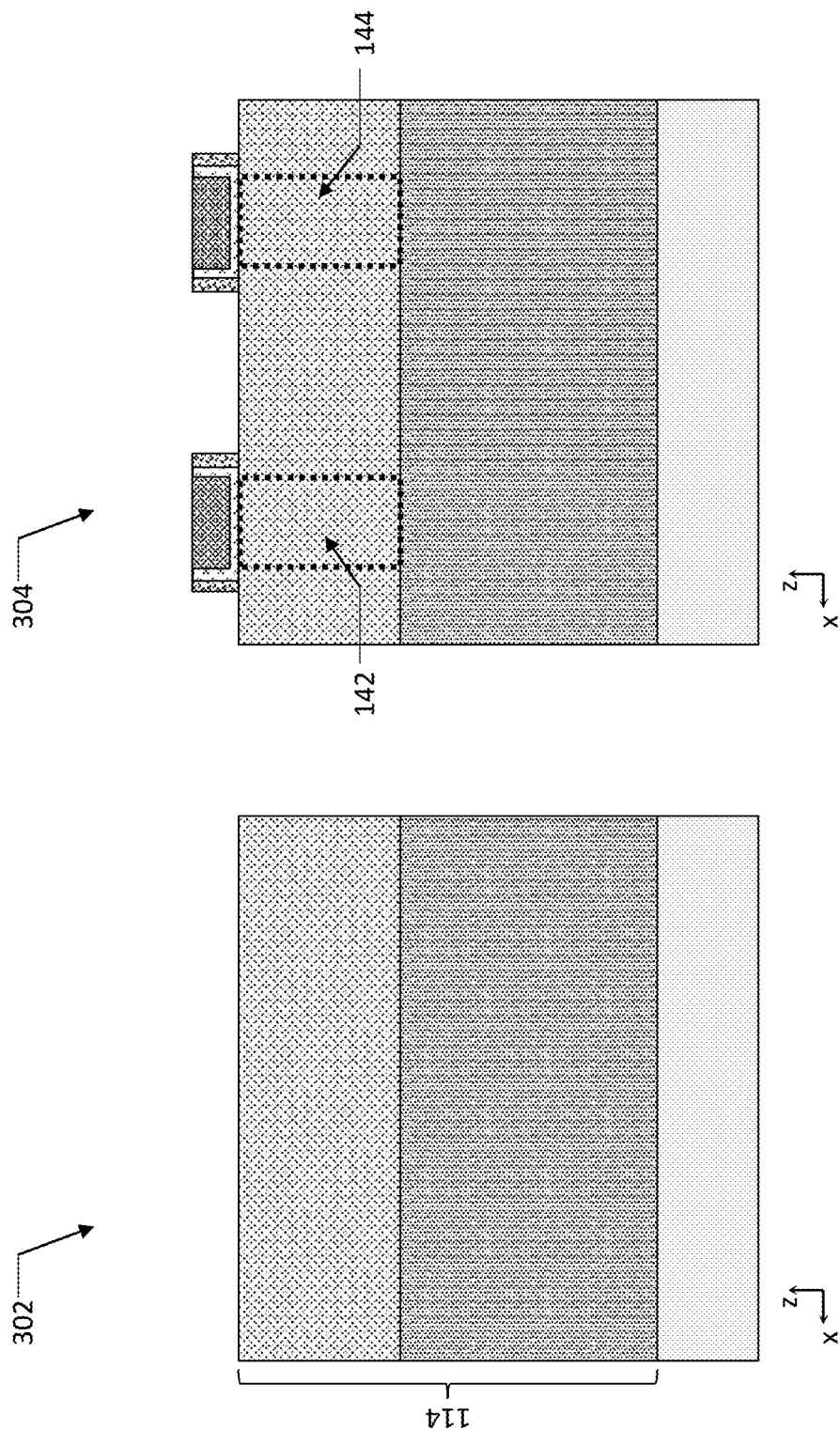

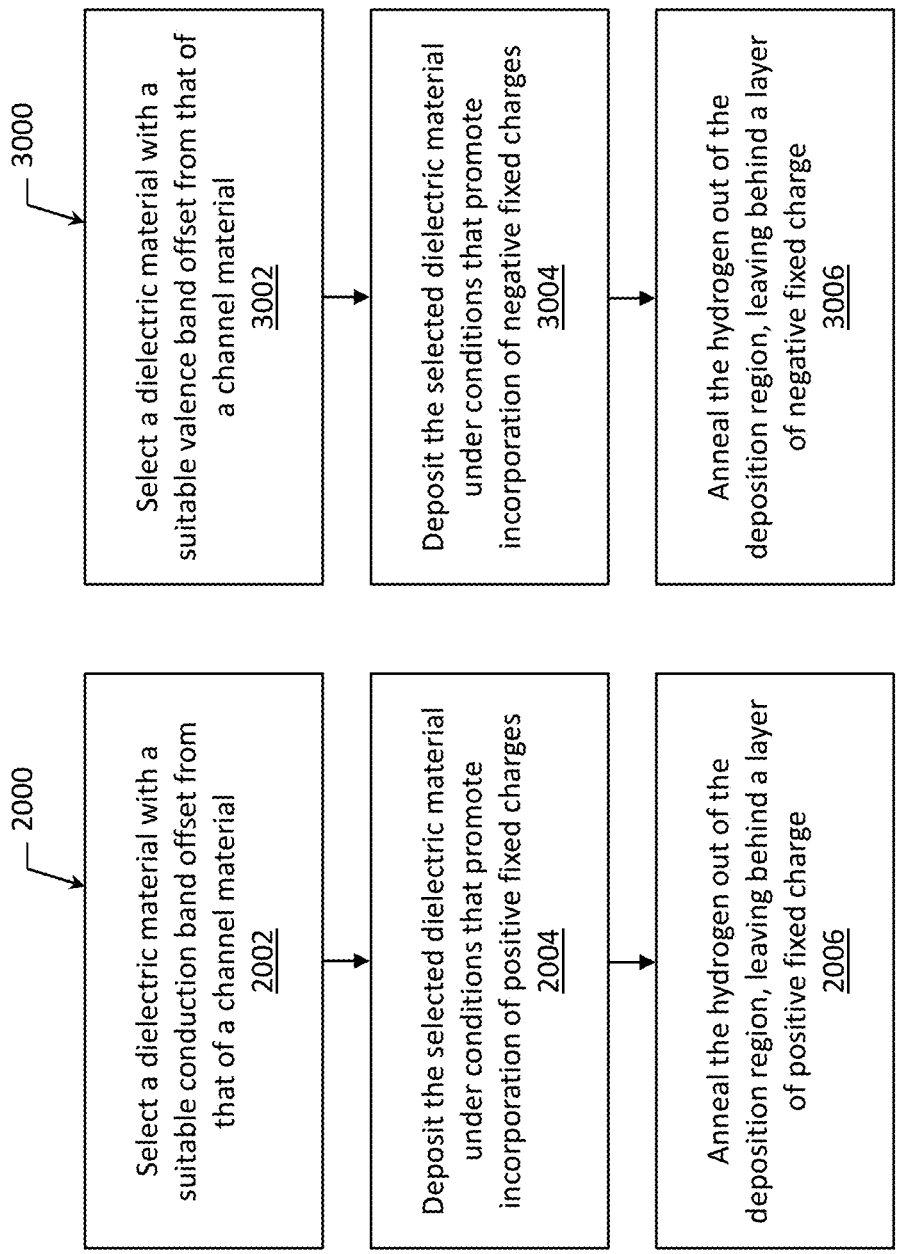

DEVICE ISOLATION BY FIXED CHARGE

This application is a national stage application under 35 U.S.C. § 371 of PCT International Application Serial No. PCT/US2016/064298, filed Dec. 1, 2016, titled "DEVICE ISOLATION BY FIXED CHARGE." The disclosure of this application is considered part of (and is incorporated by reference in) the disclosure of this application.

BACKGROUND

When two transistors are provided in sufficiently close proximity to one another, current from one may leak into the other, negatively affecting performance of both transistors.

Transistors can have planar or non-planar architecture. Recently, transistors with non-planar architecture, such as e.g. tri-gate and all-around gate transistors, have been extensively explored as alternatives to transistors with planar architecture.

Tri-gate transistors refer to transistors having a non-planar architecture where a fin, formed of one or more semiconductor materials, extends away from a base. The name "tri-gate" originates from the fact that, in use, such a transistor may form conducting channels on three "sides" of the fin. Tri-gate transistors potentially improve performance relative to single-gate transistors and double-gate transistors.

In a tri-gate transistor, sides of a portion of a fin that is closest to a base are enclosed by a dielectric material, typically an oxide, commonly referred to as a "shallow trench isolation" (STI). A gate stack that includes a stack of one or more gate electrode metals and a stack of one or more gate dielectrics is provided over the top and sides of the remaining upper portion of the fin (i.e. the portion above the STI), thus wrapping around the upper portion of the fin and forming a three-sided gate of a tri-gate transistor. The portion of the fin that is enclosed by the STI is referred to as a "subfin" while the portion of the fin over which the gate stack wraps around is referred to as a "channel" or a "channel portion." A semiconductor material of which the channel portion of the fin is formed is commonly referred to as a "channel material." A source region and a drain region are provided on the opposite ends of the fin, on either side of the gate stack, forming, respectively, a source and a drain of such a transistor.

All-around-gate transistors refer to transistors having a non-planar architecture where a wire, formed of a semiconductor material, is provided over a substrate. The semiconductor material of the wire is commonly referred to as a "channel material" because conducting channels of an all-around-gate transistor are formed within the wire. All-around-gate transistors potentially improve performance relative to tri-gate transistors because such transistors may form conducting channels on more than three "sides" of the wire.

In an all-around-gate transistor, a gate stack that includes a stack of gate electrode metal(s) and a stack of gate dielectric(s) wraps around the wire, e.g. forming a four-sided gate of an all-around-gate transistor in case the wire has a rectangular cross-section. A source region and a drain region are provided on the opposite ends of the wire, on either side of the gate stack, forming, respectively, a source and a drain of such a transistor.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 3 is a cross-sectional side view along a plane AA of the example arrangement shown in FIG. 1, in accordance with various embodiments.

FIG. 4 is a cross-sectional side view along a plane BB of the example arrangement shown in FIGS. 1 and 3, in accordance with various embodiments.

FIG. 5 is a cross-sectional side view along a plane CC of the example arrangement shown in FIGS. 1 and 3, in accordance with various embodiments.

FIG. 7 is a cross-sectional side view along a plane AA of the example arrangement shown in FIG. 6, in accordance with various embodiments.

FIG. 8 is a cross-sectional side view along a plane BB of the example arrangement shown in FIGS. 6 and 7, in accordance with various embodiments.

FIG. 9 is a cross-sectional side view along a plane CC of the example arrangement shown in FIGS. 6 and 7, in accordance with various embodiments.

FIGS. 11-15 illustrate various example stages in the manufacture of an arrangement with two tri-gate transistors and a fixed charge isolation structure, in accordance with various embodiments.

FIG. 16 is a flow diagram of an example method of providing a positive fixed charge dielectric of an isolation structure, in accordance with various embodiments.

FIG. 17 is a flow diagram of an example method of providing a negative fixed charge dielectric of an isolation structure, in accordance with various embodiments.

DETAILED DESCRIPTION

Figure 1:
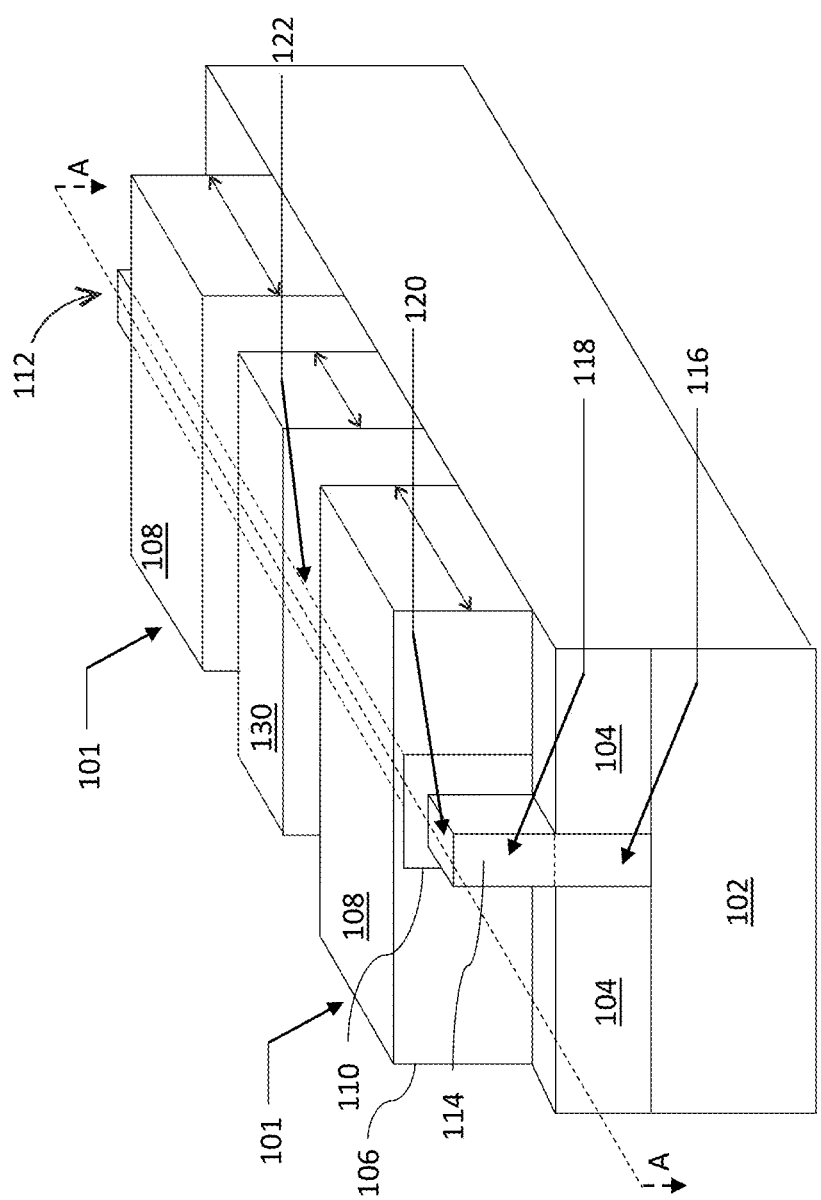
FIG. 1 is a perspective view of an example arrangement with two tri-gate transistors and a fixed charge isolation structure, in accordance with various embodiments.

Disclosed herein are tri-gate and all-around-gate transistor arrangements, and related methods and devices. For example, in some embodiments, a transistor arrangement may include a channel material (and a blocking material) disposed over a substrate; a gate electrode of a first tri-gate or all-around-gate transistor, disposed over a first part of the channel material; and a gate electrode of a second tri-gate or all-around-gate transistor, disposed over a second part of the channel material. The transistor arrangement may further include a device isolation structure made of a fixed charge dielectric material disposed over a third part of the channel material, the third part being between the first part and the second part of the channel material.

The performance of devices that include multiple non-planar transistors provided in close proximity to one another may depend on the number of factors. One factor relates to the amount of current that may leak from the channel of one transistor to the channel of an adjacent transistor. Current leaking from one transistor to another negatively affects both transistors and the overall device. Preventing or at least reducing this phenomenon is referred to as "device isolation."

Several approaches have been explored in the past in an attempt to provide adequate device isolation. Two such approaches are known as a fin trim isolation (FTI) and a fin trench isolation (FTR).

For an example of a tri-gate transistor architecture, the FTI approach involves designating spaces for a series of tri-gate transistors (each space referred to as a "poly-pitch") along the length of a fin, creating openings in the fin for every other poly-pitch to electrically separate fins of the adjacent transistors, and filling those openings with a dielectric material. Separating the fins of the adjacent tri-gate transistors by a dielectric material provides device isolation because current from the channel of one transistor does not have a path to the channel of an adjacent transistor. The depth of the FTI can go through the fin into the subfin to ensure that the subfin portions of the adjacent transistors are isolated as well.

For an example of a tri-gate transistor architecture, the FTR approach is similar to the FTI approach in that it involves designating spaces for a series of tri-gate transistors along the length of a fin, i.e. designating poly-pitches, creating openings at certain places along the length of the fin, and filling the openings with a dielectric material that provides isolation. Unlike the FTI approach, the openings of the FTR approach are wider and likely deeper. Each opening extends over parts of two adjacent poly-pitches, thus occupying more die area compared to the FTI approach.

As the foregoing illustrates, conventional approaches for providing device isolation, such as e.g. FTI and FTR, require one or even two poly-pitches for every adjacent pair of transistors. Such approaches do not allow for efficient scaling because every poly-pitch designated to providing device isolation represents a transistor lost (because a transistor cannot implemented in such a poly-pitch).

The tri-gate and all-around-gate transistor arrangements disclosed herein are based on implementing a series of transistors sharing a common semiconductor channel material that is not broken up (i.e. discontinued) by intentional inserts of a dielectric. In other words, the channel material, shaped either as a continuous fin or a continuous wire, continues from one transistor to another with the transistors implemented along the length of the fin or the wire. The arrangements disclosed herein include an isolation structure of a fixed charge dielectric material comprising either positive or negative fixed charges, the material wrapping around at least a portion of the channel material between each pair of adjacent transistors. When a fixed charge dielectric material having negative fixed charges is provided around a portion of an N-type channel material (i.e. when the first and second transistors are N-type channel transistors because their channels use electrons as the charge carriers for conduction), mobile electrons which may be present in that portion of the channel material are repelled from the negative fixed charges, due to the Coulomb forces, resulting in depletion of mobile electrons in that portion of the channel material. When a fixed charge dielectric material having positive fixed charges is provided around a portion of a P-type channel material (i.e. when the first and second transistors are P-type channel transistors because their channel uses holes as the charge carriers for conduction) mobile holes which may be present in that portion of the channel material are repelled from the positive fixed charges, again due to the Coulomb forces, resulting in depletion of mobile holes in that portion of the channel material. Because the fixed charge material provided in this manner depletes or blocks mobile carriers in a portion of the channel material between two adjacent transistors, there are less, if any, mobile carriers remaining in that portion that could contribute to current, resulting in reduction or complete elimination of current leakage between the two transistors (i.e. electrically isolating the two transistor devices from one another).

Advantageously, the proposed approach to device isolation requires significantly less space than conventional implementations such as FTI or FTR. Namely, the isolation structure provided between each two adjacent transistors according to the present disclosure can be made sufficiently thin as to occupy less than a poly-pitch between the transistors, while providing sufficient electrical isolation due to the deliberate fixed charges provided in such a structure. Consequently, the approach to device isolation proposed herein enables more efficient scaling, where larger numbers of transistors can be implemented over a given surface area of a substrate, compared to what was possible with previous device isolation techniques.

Tri-gate and all-around-gate transistor arrangements with isolation structures described herein may be implemented in one or more components associated with an integrated circuit (IC) or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

In the following detailed description, various aspects of the illustrative implementations will be described using terms commonly employed by those skilled in the art to convey the substance of their work to others skilled in the art. For example, as used herein, a "high-k dielectric" refers to a material having a higher dielectric constant than silicon oxide.

FIG. 1 is a perspective view of an example arrangement 100 with two tri-gate transistors 101 and a fixed charge isolation structure 130 between the two transistors, in accordance with various embodiments. The two tri-gate transistors 101 shown in FIG. 1 may be substantially identical, therefore details of only one of them is described and labeled with reference numerals in FIG. 1.

Although two tri-gate transistors 101 and one fixed charge isolation structure 130 between them are illustrated in FIG. 1, this is also simply for ease of illustration, and any N tri-gate transistors 101 may be provided along a single fin according to various embodiments of the present disclosure, with N−1 fixed charge isolation structures 130 (one isolation structure 130 between each pair of adjacent transistors), N being an integer equal to or greater than 2. Furthermore, note that the arrangement 100 shown in FIG. 1 is intended to show relative arrangements of some of the components therein, and that the arrangement 100, or portions thereof, may include other components that are not illustrated (e.g., electrical contacts to the source and the drain of the transistors 101, additional layers such as e.g. a spacer layer, around the gate electrode of the transistors 101, etc.).

As shown, the tri-gate transistor 101 of FIG. 1 may include a base 102, a transistor dielectric material 104, and a gate stack 106 comprising a gate electrode material 108 (which could include a stack of one or more gate electrode materials) and a gate dielectric 110 (which could include a stack of one or more gate dielectric materials). In the tri-gate transistor 101 illustrated in FIG. 1, a fin 112 formed of a semiconductor channel material 114 may extend from the base 102 of the semiconductor material.

In general, implementations of the present disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device may be built falls within the spirit and scope of the present disclosure. In various embodiments the base 102 may include any such substrate that provides a suitable surface for providing the arrangement 100.

The transistor dielectric material 104 forms an STI disposed on either side of the fin 112. A portion of the fin 112 enclosed by the STI 104 forms a subfin 116. The STI material 104 may be a low-k or high-k dielectric including but not limited to elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 104 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

The gate stack 106 may wrap around the fin 112 as shown, with a channel portion 118 corresponding to the portion of the channel material 114 of the fin 112 wrapped by the gate stack 106. In particular, the gate dielectric 110 may wrap around the channel material 114 of the fin 112, and the gate electrode material 108 may wrap around the gate dielectric 110. The horizontal dashed line shown on the front end face of the fin 112 is intended to illustrate the division between the channel portion 118 and the subfin 116, i.e. the channel portion 118 ends and the subfin portion 116 begins where the gate electrode 108 ends, which is typically where the STI 104 begins.

The gate electrode material 108 may include at least one P-type work function metal or N-type work function metal, depending on whether the transistor 101 is a P-type metal oxide semiconductor (PMOS) transistor or an N-type metal oxide semiconductor (NMOS) transistor (P-type work function metal used as the gate electrode 108 when the transistors 101 is a PMOS transistor and N-type work function metal used as the gate electrode 108 when the transistor 101 is an NMOS transistor). For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may consist of a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate dielectric 110 may include one or more high-k dielectrics including any of the materials discussed herein with reference to the STI material 104. In some embodiments, an annealing process may be carried out on the gate dielectric 110 during manufacture of the transistor 100 to improve the quality of the gate dielectric 110. The gate dielectric 110 may have a thickness, a dimension measured in the direction of the y-axis of the reference coordinate system x-y-z shown in FIG. 1, that may, in some embodiments, be between 0.5 nanometers and 3 nanometers, including all values and ranges therein (e.g., between 1 and 3 nanometers, or between 1 and 2 nanometers). In some embodiments, the gate stack 106 may be surrounded by a gate spacer, not shown in FIG. 1, but shown in the cross-sectional view of FIG. 3 as a gate spacer 111. The gate spacer 111 is configured to provide separation between the gate stacks 106 of different transistors and typically is made of a low-k dielectric material (i.e. a dielectric material that has a lower dielectric constant (k) than silicon dioxide).

The channel material 114 may be composed of semiconductor material systems including, for example, N-type or P-type materials systems. In some embodiments, the channel material 114 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. The channel material 114 may include a combination of semiconductor materials where one semiconductor material is used for the channel portion 118 and another material, sometimes referred to as a "blocking material," is used for the subfin 116. In some embodiments, the subfin 116 and the channel portion 118 are each formed of monocrystalline semiconductors. In a first embodiment, the subfin 116 and the channel portion 118 are each formed of compound semiconductors with a first sub-lattice of at least one element from group III of the periodic table (e.g., Al, Ga, In), and a second sub-lattice of at least one element of group V of the periodic table (e.g., P, As, Sb). The channel material 114 may be a binary, ternary, or quaternary III-V compound semiconductor that is an alloy of two, three, or even four elements from groups III and V of the periodic table. For exemplary N-type transistor embodiments, the channel portion 118 is advantageously a III-V material having a high electron mobility, such as, but not limited to InGaAs, InP, InSb, and InAs. For some such embodiments, the channel portion 118 is a ternary III-V alloy, such as InGaAs or GaAsSb. For some $In_xGa_{1-x}As$ fin embodiments, In content (x) is between 0.6 and 0.9, and advantageously is at least 0.7 (e.g., $In_{0.7}Ga_{0.3}As$). In some embodiments with highest mobility, the channel portion 118 is intrinsic III-V material and not intentionally doped with any electrically active impurity. In alternate embodiments, a nominal impurity dopant level may be present within the channel portion 118, for example to set a threshold voltage Vt, or to provide HALO pocket implants, etc. Even for impurity-doped embodiments however, impurity dopant level within the channel portion 118 is relatively low, for example below $10^{15}$ cm$^{-3}$, and advantageously below $10^{13}$ cm$^{-3}$. The subfin 116 is advantageously a III-V material having a significant band offset (e.g., conduction band offset for N-type devices) from the channel portion 118. Exemplary materials, include, but are not limited to, GaAs, GaSb, GaAsSb, GaP, InAlAs, GaAsSb, AlAs, AlP, AlSb, and AlGaAs. In some N-type transistor embodiments where the channel portion 118 is InGaAs, the subfin 116 is GaAs, and may also be doped with impurities (e.g., p-type) to a greater impurity level than the channel portion 118. In an alternate heterojunction embodiment, the subfin 116 and the channel portion 118 are each group IV semiconductors (e.g., Si, Ge, SiGe). The subfin 116 may be a first elemental semiconductor (e.g., Si or Ge) or a first SiGe alloy (e.g., having a wide bandgap). For exemplary P-type transistor embodiments, the channel portion 118 is advantageously a group IV material having a high hole mobility, such as, but not limited to Ge or a Ge-rich SiGe alloy. For some exemplary embodiments, the channel portion 118 has a Ge content between 0.6 and 0.9, and advantageously is at least 0.7. In some embodiments with highest mobility, the channel portion 118 is intrinsic III-V (or IV for P-type devices) material and not intentionally doped with any electrically active impurity. In alternate embodiments, one or more a nominal impurity dopant level may be present within the channel portion 118, for example to set a threshold voltage Vt, or to provide HALO pocket implants, etc. Even for impurity-doped embodiments however, impurity dopant level within the channel portion 118 is relatively low, for example below $10^{15}$ cm$^{-3}$, and advantageously below $10^{13}$ cm$^{-3}$. The subfin 116 is advantageously a group IV material having a significant band offset (e.g., valance band offset for P-type devices) from the channel portion 118. Exemplary materials, include, but are not limited to, Si or Si-rich SiGe. In some P-type transistor embodiments, the subfin 116 is Si and may also be doped with impurities (e.g., n-type) to a higher impurity level than the channel portion 118.

The fin 112 may include a source region 120 and a drain region 122 on either side of the gate stack 106, as shown, thus realizing a transistor. As is well known in the art, source and drain regions are formed for the gate stack of each MOS transistor. The source and drain regions may generally be formed using either an implantation/diffusion process or an etching/deposition process. In the former process, dopants such as boron, aluminum, antimony, phosphorous, or arsenic may be ion-implanted into the channel material 114 to form the source and drain regions. An annealing process that activates the dopants and causes them to diffuse further into the channel material 114 typically follows the ion implantation process. In the latter process, the channel material 114 may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. Although not specifically shown in the perspective illustration of FIG. 1, in further embodiments, one or more layers of metal and/or metal alloys are typically used to form the source and drain contacts, e.g. shown in FIG. 3 as source/drain contacts 140 which may include any one or more electrically conductive materials.

The transistor 101 may have a gate length (i.e. a distance between the source region 120 and the drain region 122 of the transistor 101), a dimension measured along the fin 112, in the direction of the x-axis of an exemplary reference coordinate system x-y-z shown in FIG. 1, which may, in some embodiments, be between 20 and 40 nanometers, including all values and ranges therein (e.g. between 22 and 35 nanometers, or between 20 and 30 nanometers). The fin 112 may have a thickness, a dimension measured in the direction of the y-axis of the reference coordinate system x-y-z shown in FIG. 1, that may, in some embodiments, be between 5 and 30 nanometers, including all values and ranges therein (e.g. between 7 and 20 nanometers, or between 10 and 15 nanometers). The fin 112 may have a height, a dimension measured in the direction of the z-axis of the reference coordinate system x-y-z shown in FIG. 1, which may, in some embodiments, be between 30 and 350 nanometers, including all values and ranges therein (e.g. between 30 and 200 nanometers, between 75 and 250 nanometers, or between 150 and 300 nanometers).

Although the fin 112 illustrated in FIG. 1 is shown as having a rectangular cross section in a z-y plane of the reference coordinate system shown in FIG. 1, the fin 112 may instead have a cross section that is rounded or sloped at the "top" of the fin 112, and the gate stack 106 may conform to this rounded or sloped fin 112. In use, the tri-gate transistor 101 may form conducting channels on three "sides" of the fin 112, potentially improving performance relative to single-gate transistors (which may form conducting channels on one "side" of a channel material) and double-gate transistors (which may form conducting channels on two "sides" of a channel material).

In the arrangement 100, the isolation structure 130 is provided between the two transistors 101. More specifically, the isolation structure is provided between the drain region 122 of the first transistor 101 (in the illustration of FIG. 1—the transistor closest to the viewer of the perspective view of FIG. 1) and the source region 120 of the second transistor (in the illustration of FIG. 1—the transistor farthest away from the viewer of the perspective view of FIG. 1). The isolation structure 130 is provided as a layer of a fixed charge material 132 provided substantially perpendicular to the base 102 and substantially parallel to the gate electrodes 108 of the first and second transistors 101.

In general, a fixed charge material is a dielectric material that contains fixed charges (i.e. charges which are not mobile), which could be either positive or negative charges depending on a bandgap of a dielectric material and on how the dielectric material was formed/processed, with the concentration of the fixed charges in the fixed charge material being higher than that accounting for whichever unintentional fixed charges may be present in a typical dielectric of the same type of material. For example, the concentration of the fixed charges in the fixed charge dielectric material 132 may be $10^{12}$, or higher, per square centimeter.

Conventionally, having fixed charges in or around transistors has been something to avoid and to reduce (unintentional small amounts of fixed charges are often inevitable), by careful architecture design, choice of materials, and tight control of fabrication processes. In contrast to this conventional line of thinking, inventors of the present disclosure realized that deliberately adding fixed charge, to carefully and specifically selected locations of a transistor arrangement, may actually provide advantages. This realization is based on recognition that, in context of the transistor arrangement 100, if a dielectric material having a sufficient amount of fixed charges is provided in sufficiently close proximity to a part of the channel material 114 where it is desirable to prevent flow of any currents, then the fixed charges of the fixed charge dielectric material can interact with the mobile charges in the channel material 114 by Coulomb forces and can deplete or block mobile charges in that part of the channel material, which could be used to isolate different transistors 101.

Several considerations are important in providing a suitable isolation structure 130 formed of a suitable fixed charge dielectric material 132.

One consideration is the proper choice of fixed charges to be provided in the dielectric material 132. In context of the transistor arrangement 100, fixed charges arise when there are unoccupied electron states of donor type in the fixed charge dielectric material 132 which are higher in energy than a conduction band of the channel material 114 (such fixed charges are referred to as "positive fixed charges") or occupied electron states of acceptor type in the fixed charge dielectric material 132 which are lower in energy than a valence band of the channel material 114 (such fixed charges are referred to as "negative fixed charges"). Whether the dielectric material 132 is to implement positive or negative charges depends on whether the channel material 114 is an N-type or a P-type channel material, and on the bandgaps of the dielectric material 132 and the channel material (the latter described in greater detail below with reference to FIG. 2).

For an N-type channel material 114, the fixed charge dielectric material 132 should have sufficient concentration of negative fixed charges, e.g. greater than $10^{12}$ negative charges per square centimeter. Due to the Coulomb forces, the negative fixed charges of the material 132 will repel the mobile electrons (i.e. the charge carriers of the N-type channel transistors 101), in the area of the channel material 114 over which the fixed charge dielectric material 132 is provided. Eliminating/depleting mobile electrons in a part of the N-type channel material 114 means that no mobile electrons remain there to contribute to current. Similarly, for a P-type channel material 114, the fixed charge dielectric material 132 should have sufficient concentration of positive fixed charges, e.g. greater than $10^{12}$ positive charges per square centimeter. Due to the Coulomb forces, the positive fixed charges of the material 132 will repel the mobile holes (i.e. the charge carriers of the P-type channel transistors 101), in the area of the channel material 114 over which the fixed charge dielectric material 132 is provided. Eliminating/depleting mobile holes in a part of the P-type channel material 114 means that no mobile holes remain there to contribute to current. Thus, in general, eliminating/depleting the mobile charge carriers in a part of the channel material 114 means that no mobile carriers remain in that part to contribute to current. When such a part of the channel material 114 is selected to be between two adjacent transistors 101, namely between the closest source/drain regions of the two transistors 101, current cannot flow in that part of the channel material and the two transistors 101 are electrically isolated.

Figure 2:
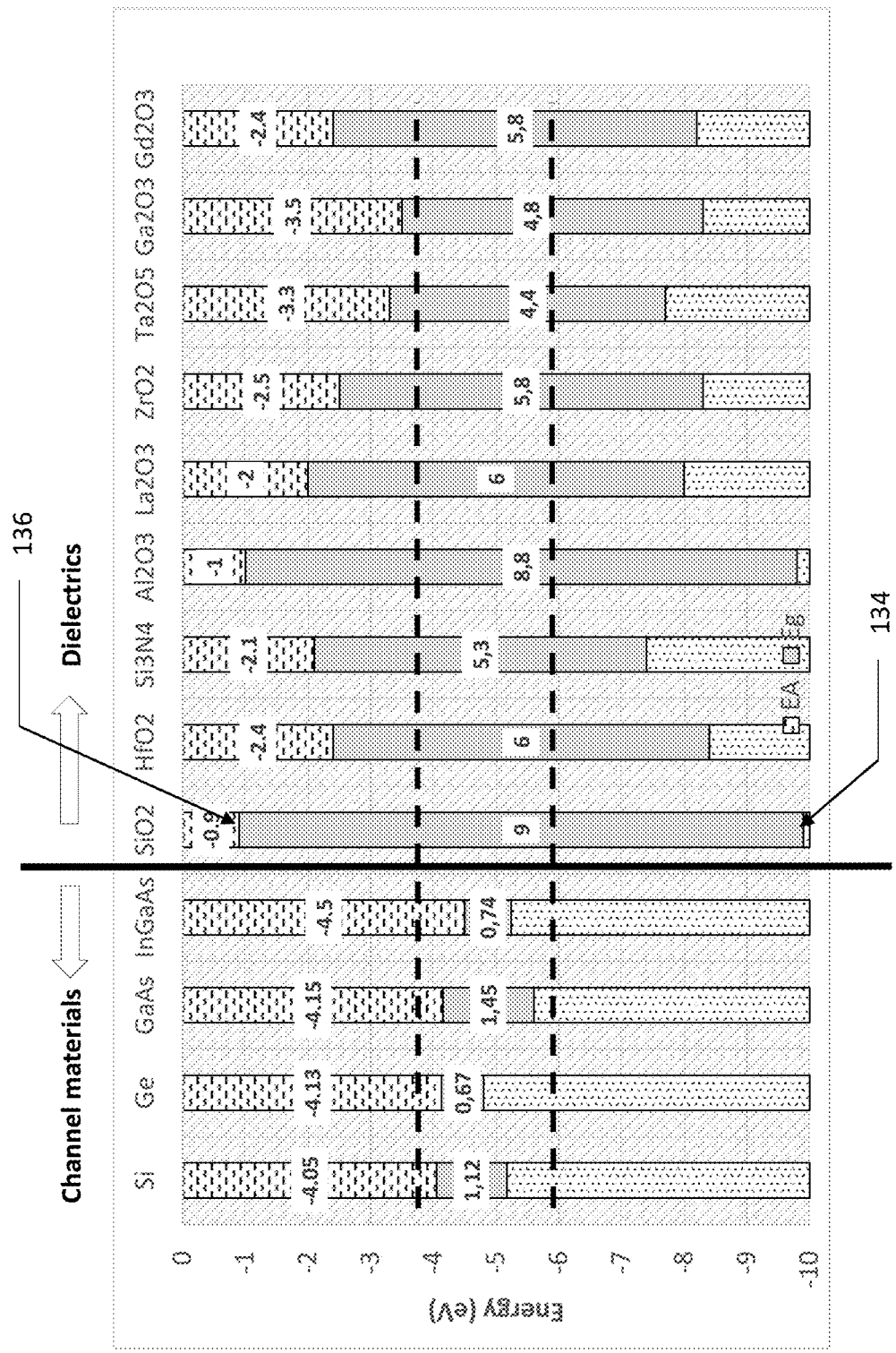
FIG. 2 is an illustration of bandgaps of several exemplary semiconductor materials for use as the channel materials for the transistors described herein and of several exemplary dielectric materials for use as the fixed charge dielectric materials for the isolation structures described herein.

Another consideration that is important in providing a suitable isolation structure 130 is the proper selection and processing of the dielectric material to be used as the fixed charge material 132. As described above, positive fixed charges can be created when there are unoccupied electron states of donor type in the fixed charge dielectric material 132 which are higher in energy than the bottom conduction band of the channel material 114 while negative fixed charges can be created when there are occupied electron states of acceptor type in the fixed charge dielectric material 132 which are lower in energy than the top valence band of the channel material 114. FIG. 2 illustrates bandgaps of several exemplary channel materials which could be used as the channel material 114 and several exemplary dielectric materials which could be used as the fixed charge dielectric material 132. A bandgap of each material shown in FIG. 2 is the energy difference (in electron volts, shown along the vertical axis of FIG. 2) between the top of the valence band 134 and the bottom of the conduction band 136, labeled in FIG. 2 only for silicon dioxide (SiO2), as an example.

As is shown in FIG. 2, some dielectric materials can be discounted right away from being used for creating fixed charges of a particular sign (either positive or negative) because their band offset from the respective channel material is not sufficiently large. In this context, when evaluating a potential dielectric material for forming a positive fixed charge dielectric material, the term "band offset" (more specifically, "conduction band offset") refers to the difference in energy values between the bottom of the conduction band of the potential dielectric material and the bottom of the conduction band of the channel material. On the other hand, when evaluating a potential dielectric material for forming a negative fixed charge dielectric material, the term "band offset" (more specifically, "valence band offset") refers to the difference in energy values between the top of the valence band of the channel material and the top of the valence band of the potential dielectric material. For example, as can be seen in FIG. 2, the bandgap of gallium oxide (Ga2O3) is such that there are relatively few unoccupied electron states of donor type, as indicated by their bottom of the conduction band values 136, which are higher in energy than the bottom of the conduction bands of the channel materials shown in FIG. 2, i.e. the conduction band offset is relatively small, compared to other dielectrics shown in FIG. 2. Therefore, gallium oxide would not be the preferred dielectric material to form a positive fixed charge dielectric structure as described herein to electrically isolate P-MOS channel transistors 101. Similarly, the bandgap of tantalum pentoxide (Ta2O5) is such that, compared to gallium oxide (Ga2O3), there are somewhat more unoccupied electron states of donor type which are higher in energy than the conduction bands of the channel materials shown in FIG. 2, so tantalum pentoxide would make a better dielectric than gallium oxide to use with P-MOS channel transistors. However, compared to still other dielectrics shown in FIG. 2, even tantalum pentoxide has relatively few unoccupied electron states of donor type which are higher in energy than the bottom of the conduction bands of the channel materials shown in FIG. 2.

All of the dielectric materials shown in FIG. 2 appear to be sufficiently suitable for implementing negative fixed charges for use in the isolation structure 130 provided between two transistors 101 having an N-type channel (i.e. all of the dielectric materials shown in FIG. 2 appear to have adequate numbers of occupied electron states of acceptor type, as indicated by their top of the valence band values 134, which are lower in energy than valence bands of potential channel materials shown in FIG. 2; in other words, all of the dielectric materials shown in FIG. 2 appear to have sufficiently large valence band offsets compared to typical channel materials).

Some of the dielectric materials shown in FIG. 2 appear to be suitable for implementing both positive fixed charges and negative fixed charges for use in the isolation structure 130, such as e.g. silicon dioxide (SiO2) which could have both unoccupied electron states of donor type (as indicated by its bottom of the conduction band 136 being sufficiently far, in terms of eV, from the conduction band of potential channel materials shown in FIG. 2) for forming positive fixed charges as well as occupied electron states of acceptor type (as indicated by its top of the valence band 134 being sufficiently far, in terms of eV, from the valence band of potential channel materials shown in FIG. 2) for forming negative fixed charges. Whether such a material will have positive or negative fixed charges depends on how the material is processed/fabricated, as described in greater detail below. In other words, a given dielectric material (i.e. a material having a certain valence and conduction band values), may be processed to deliberately have a certain concentration of positive charges or a certain concentration of negative charges. A given dielectric material could also be processed to minimize/reduce the amount of fixed charges. For example, dielectric materials used in transistor devices, e.g. the dielectric material used as the STI 104 or the dielectric material used as the gate dielectric 110, are typically processed to minimize the amount of fixed charges and, therefore, may have only some unintentional fixed charges still present therein, in concentrations far below the concentration of fixed charges that is intentionally provided in the fixed charge dielectric material 132 according to embodiments of the present disclosure.

Yet another consideration that is important in providing a suitable isolation structure 130 is the amount of fixed charges provided within the fixed charge dielectric material 132. The more fixed charges are in the dielectric material 132, the higher level of mobile carrier depletion can be achieved in the part of the channel material 114 over which the isolation structure 130 is provided. One factor that affects the amount of fixed charges in the dielectric material 132 is the concentration of fixed charges in the material—the higher the concentration, the more fixed charges can be present in a given area/volume. Another factor is the area volume of the material 132 that is in sufficient proximity to the channel material 114 to deplete mobile carriers there due to Coulomb interactions. In that respect, a thickness of the fixed charge material 132, a dimension measured in the direction of the x-axis of the reference coordinate system x-y-z shown in FIG. 1, becomes important. In some embodiments, the thickness of the fixed charge material 132 may be between 5 nanometers and 20 nanometers, including all values and ranges therein (e.g., between 5 and 15 nanometers, or between 7 and 10 nanometers). The greater this thickness, the higher levels of depletion can be achieved, although at the cost of a larger area of the common channel material 114 taken up for device isolation and lost to transistor implementation. In general, the greater the surface area of the fixed charge material 132 that is in contact with the common channel material 114, the greater depletion of the mobile carriers in the channel material 114 enclosed by the surface can be achieved. A person of ordinary skill in the art would recognize further similar considerations in appropriate selection of the isolation structure 130, all of which being within the scope of the present disclosure.

FIGS. 3-5 are cross-sectional views of the arrangement 100 shown in FIG. 1, in accordance with various embodiments. In particular, FIG. 3 illustrates a cross-section of the arrangement 100 taken along the section A-A of FIG. 1 (i.e. the x-z plane of the reference coordinate system shown in FIG. 1), FIG. 4 illustrates a cross-section of the arrangement 100 taken along the section B-B of FIG. 3 (i.e. the z-y plane of the reference coordinate system shown in FIG. 1; at the same time FIG. 3 illustrates a cross-section of the arrangement 100 taken along the section D-D of FIG. 4), and FIG. 5 illustrates a cross-section of the arrangement 100 taken along the section C-C of FIG. 3 (i.e. the z-y plane of the reference coordinate system shown in FIG. 1; at the same time FIG. 3 illustrates a cross-section of the arrangement 100 taken along the section E-E of FIG. 5). Thus, cross-sectional views taken along the section A-A of FIG. 1, along the section D-D of FIG. 4, and along the section E-E of FIG. 5 are the same—the view of FIG. 3. A number of elements labeled in FIG. 1 with reference numerals are indicated in FIGS. 3-5 with different patterns, with a legend showing the correspondence between the reference numerals and patterns being provided at the bottom of FIGS. 3-5. In particular, the legend illustrates that FIGS. 3-5 use different patterns to show the base 102, the STI 104, the gate electrode material 108, the gate dielectric 110, the subfin portion 116 of the fin, the channel portion 118, the fixed charge dielectric material 132, and the source/drain contact material 140 of the source/drain regions.

FIGS. 3-5 are intended to provide an illustration of some further details of the arrangement 100, thus all of the descriptions provided above with respect to reference numerals indicated in FIG. 1 are applicable to FIGS. 3-5 and are not repeated.

The transistor with the source region 120 and the drain region 122 shown on the left side of FIG. 3 is the first transistor 101 of FIG. 1, while the transistor with the source region 120 and the drain region 122 shown on the right side of FIG. 3 is the second transistor 101 of FIG. 1.

FIG. 3 further illustrates, a first part 142 of the channel material 114, over which the gate electrode 108 of the first transistor 101 is disposed (the first part 142 indicated with a dotted line contour on the left side of FIG. 3), a second part 144 of the channel material 114, over which the gate electrode 108 of the second transistor 101 is disposed (the second part 144 indicated with a dotted line contour on the right side of FIG. 3), and a third part 146 of the channel material 114, over which the isolation structure 130 is disposed (the third part 146 indicated with a dashed line contour in the middle of FIG. 3). The illustration of FIG. 3 makes clear that the third part 146 is provided between the first part 142 and the second part 144. More specifically, the third part 146 is provided between the drain region 122 of the first transistor 101 and the source region 120 of the second transistor. Depleting the third part 146 of mobile carriers, by virtue of providing the fixed charge dielectric material 132 around it, as described herein, ensures that no current is flowing between the first and second transistors 101, thus providing isolation between these two devices. The distance between the drain region 122 of the first transistor 101 and the source region 120 of the second transistor (i.e. the thickness of the third part 146) can be made smaller than a poly-pitch in which a transistor could be provided, thus enabling more compact multiple transistor arrangements with adequate device isolation. In various embodiments, the shortest distance between the first part 142 and the second part 144 may be between 25 nanometers and 60 nanometers, including all values and ranges therein, e.g. between 30 and 40 nanometers, or between 27 and 35 nanometers. On the other hand, the thickness of the third part 146 may be between 5 nanometers and 20 nanometers, e.g. between 5 and 10 nanometers, or between 7 and 15 nanometers.

FIG. 4 illustrates that the fixed charge dielectric material 132 wraps around the fin 112, namely, around the channel portion 118. FIG. 4 also illustrates that if the fixed charge dielectric material 132 is a negative fixed charge material (as illustrated in FIG. 4 with "−" signs within the fixed charge dielectric material 132 along the interface with the channel portion 118) and the channel material 114 is an N-type semiconductor material, then it depletes the channel portion 118 of mobile electrons, which are the charge carriers for the NMOS transistors 101, leaving holes behind in the third part 146 of the channel portion 118 (as illustrated in FIG. 4 with "+" signs within the channel portion 118 along the interface with the fixed charge dielectric material 132), eliminating, or at least reducing, possibilities for current conduction in the third part 146.

FIG. 4 illustrates that the fixed charge dielectric material 132 may be in contact with the channel portion 118, i.e. without any interface layers, in order to ensure maximum Coulomb interactions between the fixed charges in the fixed charge dielectric material 132 and whichever mobile carriers may be present in the third part 146 of the channel portion 118.

While FIG. 4 illustrates an example of a negative fixed charge for an NMOS channel, an example of a positive fixed charge dielectric material 132 for a PMOS channel material 114 may be provided by switching the "−" and the "+" signs shown in FIG. 4.

FIG. 5 illustrates the gate stack 106 wrapping around the channel portion 118 in the third part 146. Namely, FIG. 5 illustrates the gate dielectric 110 wrapping around the channel portion 118 and the gate electrode material 108 wrapping around the gate dielectric 110. A comparison of the views of FIGS. 4 and 5 also reveals that the geometry of the fixed charge dielectric material 132 may conform to that of the gate electrode material 108, as is also shown in the exemplary illustration of FIG. 1.

For the first part 142, a cross-sectional view of the z-y plane would be the same as that shown in FIG. 5.

Figure 6:
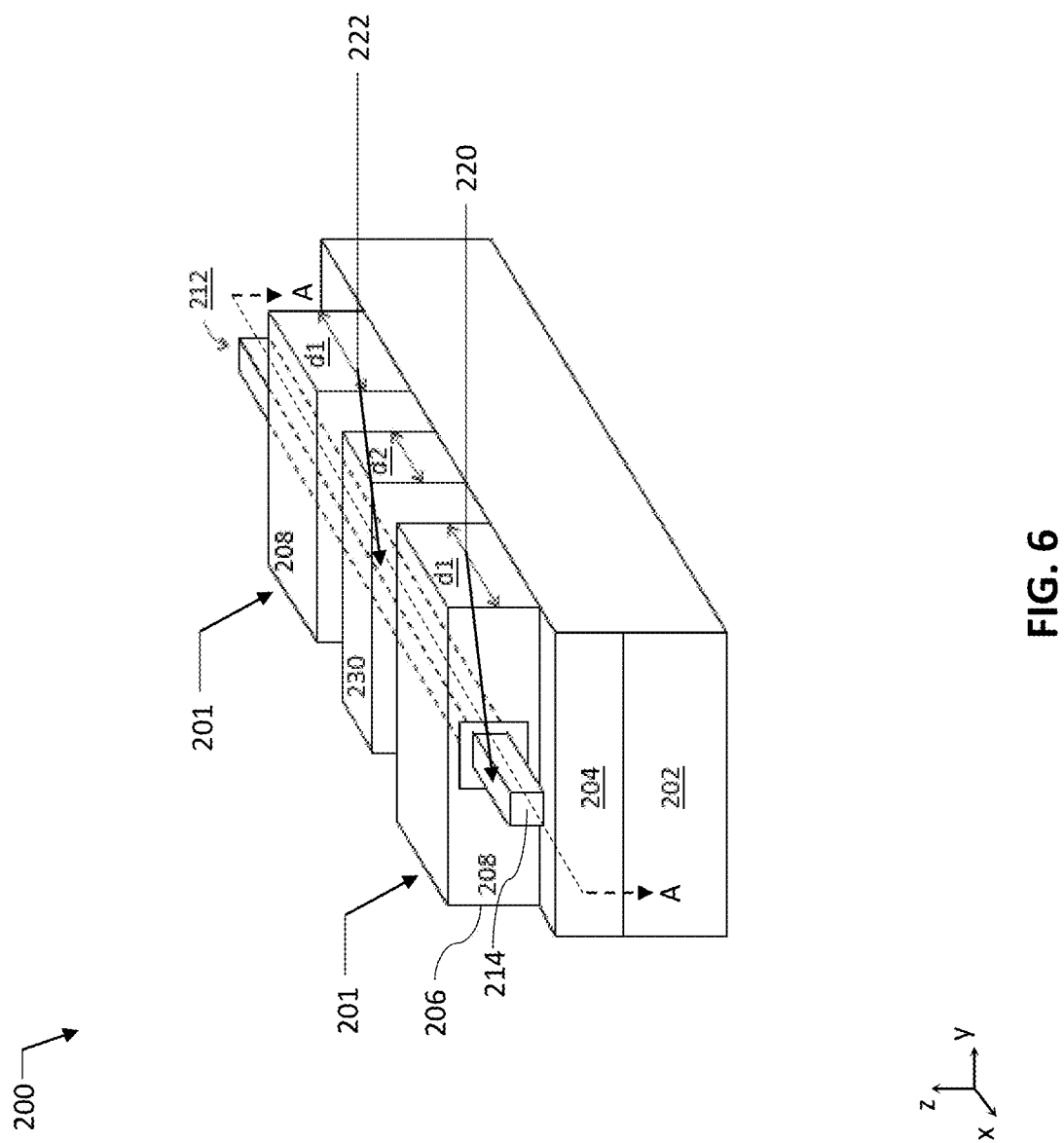
FIG. 6 is a perspective view of an example arrangement with two all-around-gate transistors and a fixed charge isolation structure, in accordance with various embodiments.

FIG. 6 is a perspective view of an example arrangement 200 with two all-around-gate transistors 201 and a fixed charge isolation structure 230, in accordance with various embodiments.

The two all-around-gate transistors 201 shown in FIG. 6 may be substantially identical, therefore details of only one of them is described and labeled with reference numerals in FIG. 6.

Although two all-around-gate transistors 201 and one fixed charge isolation structure 230 between them are illustrated in FIG. 6, this is also simply for ease of illustration, and any N all-around-gate transistors 201 may be provided along a single wire according to various embodiments of the present disclosure, with N−1 fixed charge isolation structures 230 (one isolation structure 230 between each pair of adjacent all-around-gate transistors), N being an integer equal to or greater than 2. Furthermore, note that the arrangement 200 shown in FIG. 6 is intended to show relative arrangements of some of the components therein, and that the arrangement 200, or portions thereof, may include other components that are not illustrated (e.g., electrical contacts to the source and the drain of the transistors 201, additional layers such as e.g. a spacer layer, around the gate electrode of the transistors 201, etc.).

As shown, the all-around-gate transistor 201 of FIG. 6 may include a substrate 202, an optional intermediate layer 204, and a gate stack 206 comprising a gate electrode material 208 and a gate dielectric 210. In some embodiments, the gate stack 206 may be surrounded by a gate spacer, not shown in FIG. 6, but shown in the cross-sectional view of FIG. 7 as a gate spacer 211. The gate spacer 211 is configured to provide separation between the gate stacks 206 of different transistors and typically is made of a low-k dielectric material as described herein with reference to the gate spacer 111. Unless described otherwise, discussions regarding the substrate 102, the gate stack 106, the gate electrode material 108, the gate dielectric 110, and the gate spacer 111 provided above are applicable to the substrate 202, the gate stack 206, the gate electrode material 208, the gate dielectric 210, and the gate spacer 211, respectively, and, therefore, in the interests of brevity, are not repeated.

Unlike the fin 112 that extends away from the base in the arrangement 100, the arrangement 200 includes a wire 212 that is provided above the substrate and the intermediate layer 204. Thus, in the all-around-gate transistor 201 illustrated in FIG. 6, a wire 212 formed of a semiconductor channel material 214 (or a combination of semiconductor materials) may extend above the substrate 202.

The wire 212 may take the form of a nanowire or nanoribbon, for example. The gate stack 206 may wrap entirely or almost entirely around the wire 212, as shown, with the channel material 214 corresponding to the portion of the wire 212 wrapped by the gate stack 206. In particular, the gate dielectric 210 may wrap around the channel material 214 of the wire 212, and the gate electrode material 208 may wrap around the gate dielectric 210. The wire 212 may include a source region 220 and a drain region 222 on either side of the gate stack 206, as shown, thus realizing a transistor. The source and drain regions 220 and 222 may be contacted with source/drain contacts 240 (shown in FIG. 7) analogous to the source/drain contacts 140 described herein. The transistor 201 may have a gate length (i.e. a distance between the source region 220 and the drain region 222 of the transistor 201), a dimension measured along the wire 212, in the direction of the x-axis of an exemplary reference coordinate system x-y-z shown in FIG. 6, which may, in some embodiments, be between 20 and 40 nanometers, including all values and ranges therein (e.g. between 22 and 35 nanometers, or between 20 and 30 nanometers). The composition of the substrate, the channel material, the gate dielectric, the gate electrode, the source region and the drain region may take the form of any of the embodiments disclosed herein, or known in the art.

In the arrangement 200, the isolation structure 230 is provided between the two transistors 201. More specifically, the isolation structure is provided between the drain region 222 of the first transistor 201 (in the illustration of FIG. 6—the transistor closest to the viewer of the perspective view of FIG. 6) and the source region 220 of the second transistor (in the illustration of FIG. 6—the transistor farthest away from the viewer of the perspective view of FIG. 6). The isolation structure 230 is provided as a layer of a fixed charge material 232 provided substantially perpendicular to the substrate 202 and substantially parallel to the gate electrodes 208 of the first and second transistors 201. Considerations regarding the fixed charge dielectric material provided above for the fixed charge dielectric material 132 are applicable to the fixed charge dielectric material 232 and, therefore, are not repeated here.

Although the wire 212 illustrated in FIG. 6 is shown as having a rectangular cross-section, the wire 212 may instead have a cross-section that is rounded or otherwise irregularly shaped, and the gate stack 206 and the isolation structure 230 may conform to the shape of the wire 212. In use, the all-around-gate transistor 201 may form conducting channels on more than three "sides" of the wire 212, potentially improving performance relative to tri-gate transistors.

FIGS. 7-9 are cross-sectional views of the arrangement 200 shown in FIG. 6, in accordance with various embodiments. In particular, FIG. 7 illustrates the arrangement 200 taken along the section A-A of FIG. 6 (i.e. the x-z plane of the reference coordinate system shown in FIG. 1), FIG. 8 illustrates the arrangement 200 taken along the section B-B of FIG. 7 (i.e. the z-y plane of the reference coordinate system shown in FIG. 6; at the same time FIG. 7 illustrates the arrangement 200 taken along the section D-D of FIG. 8), and FIG. 9 illustrates the arrangement 200 taken along the section C-C of FIG. 7 (i.e. the z-y plane of the reference coordinate system shown in FIG. 6; at the same time FIG. 7 illustrates the arrangement 200 taken along the section E-E of FIG. 9). Thus, cross-sectional views taken along the section A-A of FIG. 6, along the section D-D of FIG. 8, and along the section E-E of FIG. 9 are the same—the view of FIG. 7. A number of elements labeled in FIG. 6 with reference numerals are indicated in FIGS. 7-9 with different patterns, a legend providing the correspondence between the reference numerals and patterns provided at the bottom of FIGS. 7-9. In particular, the legend illustrates that FIGS. 7-9 use different patterns to show the substrate 202, the transistor dielectric 204, the gate electrode material 208, the gate dielectric 210, the channel material 214, the fixed charge dielectric material 232, and the source/drain contact material 240 of the source/drain regions.

FIGS. 7-9 are intended to provide an illustration of some further details of the arrangement 200, thus all of the descriptions provided above with respect to reference numerals indicated in FIG. 6 are applicable to FIGS. 7-9 and are not repeated.

The transistor with the source region 220 and the drain region 222 shown on the left side of FIG. 7 is the first transistor 201 of FIG. 6, while the transistor with the source region 220 and the drain region 222 shown on the right side of FIG. 7 is the second transistor 201 of FIG. 6.

FIG. 7 further illustrates, a first part 242 of the channel material 214, over which the gate electrode 208 of the first transistor 201 wraps around (the first part 242 indicated with a dotted line contour on the left side of FIG. 7), a second part 244 of the channel material 214, over which the gate electrode 208 of the second transistor 201 wraps around (the second part 244 indicated with a dotted line contour on the right side of FIG. 7), and a third part 246 of the channel material 214, over which the isolation structure 230 wraps around (the third part 246 indicated with a dashed line contour in the middle of FIG. 7). The illustration of FIG. 7 makes clear that the third part 246 is provided between the first part 242 and the second part 244. More specifically, the third part 246 is provided between the drain region 222 of the first transistor 201 and the source region 220 of the second transistor. Depleting the third part 246 of mobile carriers, by virtue of having the fixed charge dielectric material 232 wrapping around it, as described herein, ensures that no current is flowing between the first and second transistors 201, thus providing isolation between these two devices. The distance between the drain region 222 of the first transistor 201 and the source region 220 of the second transistor (i.e. the thickness of the third part 246) can be made smaller than a poly-pitch in which a transistor could be provided, thus enabling more compact multiple transistor arrangements with adequate device isolation. In various embodiments, the shortest distance between the first part 242 and the second part 244 may be between 20 nanometers and 60 nanometers, including all values and ranges therein, e.g. between 30 and 40 nanometers, or between 27 and 35 nanometers. On the other hand, the thickness of the third part 246 may be between 5 nanometers and 20 nanometers, e.g. between 5 and 10 nanometers, or between 7 and 15 nanometers.

FIG. 8 illustrates that the fixed charge dielectric material 232 wraps around the wire 212, namely, around the channel material 214 of the wire 212. FIG. 8 also illustrates that if the fixed charge dielectric material 832 is a positive fixed charge material (as illustrated in FIG. 8 with "+" signs within the fixed charge dielectric material 232 along the interface with the channel material 214) and the channel material 214 is a P-type semiconductor material, then it depletes the channel 214 of mobile holes, which are the charge carriers for the PMOS transistors 201, leaving electrons behind in the third part 246 of the channel 214 (as illustrated in FIG. 8 with "−" signs within the channel 214 along the interface with the fixed charge dielectric material 232), eliminating, or at least reducing, possibilities for current conduction in the third part 246.

FIG. 8 illustrates that the fixed charge dielectric material 232 may be in contact with the channel material 214 of the wire 212, i.e. without any interface layers, in order to ensure maximum Coulomb interactions between the fixed charges in the fixed charge dielectric material 232 and whichever mobile carriers may be present in the third part 246 of the channel material 214.

While FIG. 8 illustrates an example of a positive fixed charge for a PMOS channel, an example of a negative fixed charge dielectric material 232 for an NMOS channel material 214 may be provided by switching the "−" and the "+" signs shown in FIG. 8.

FIG. 9 illustrates the gate stack 206 wrapping around the channel material 214 of the wire 212 in the second part 244. Namely, FIG. 9 illustrates that the gate dielectric 210 wrapping around the channel material 214 and the gate electrode material 208 wrapping around the gate dielectric 210. For the first part 242, a cross-sectional view of the z-y plane would be the same as that shown in FIG. 9.

Although the isolation structures 130 and 230 are shown as extending away from the channel material 114/214 in the y-z plane of the reference system shown in the FIGS, in some embodiments the isolation structures 130/230 may comprise a liner of a fixed charge dielectric material 132/232, the liner having a thickness in the dimension measured in the direction of the y-axis of the reference system shown in the FIGS between 2 and 10 nanometers, e.g. between 2 and 5 nanometers.

Figure 10:
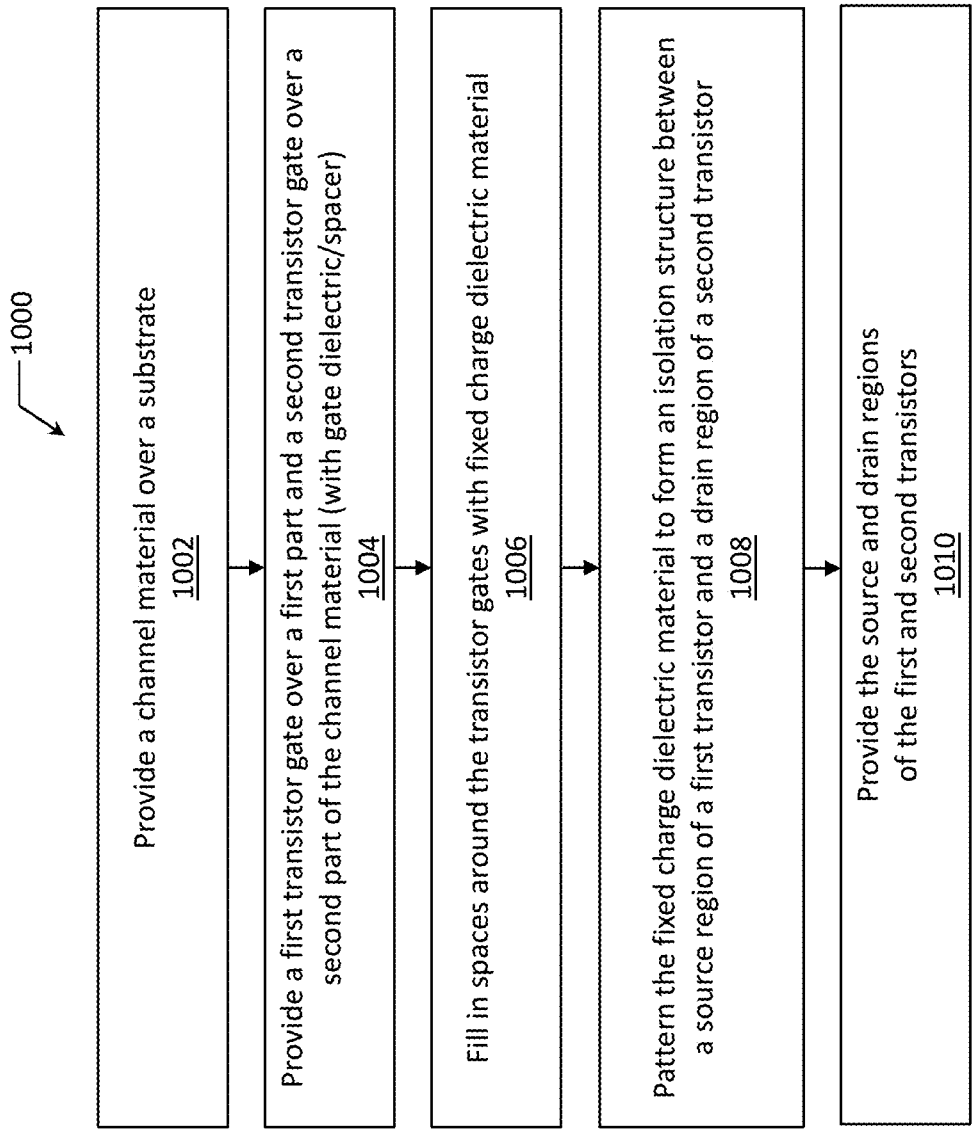
FIG. 10 is a flow diagram of an example method of manufacturing an arrangement with two tri-gate or all-around-gate transistors and a fixed charge isolation structure, in accordance with various embodiments.

The arrangements 100 and 200 disclosed herein may be manufactured using any suitable techniques. FIG. 10 is a flow diagram summarizing an example method 1000 of manufacturing either the arrangement 100 or the arrangement 200, in accordance with various embodiments. FIGS. 11-15 illustrate various example stages in the manufacturing process summarized in FIG. 10, where FIGS. 11-15 are illustrated for the example of the arrangement 100 with two tri-gate transistors 101 and the fixed charge isolation structure 130, in accordance with various embodiments. Conceptually, example stages in the manufacturing process as shown in FIGS. 11-15 for tri-gate transistors are applicable to the all-around gate transistors as well, provided that the architectural differences as described above with reference to the differences between the tri-gate arrangement 100 and the all-around-gate arrangement 200 are implemented. Therefore, in the interests of brevity, examples stages in the manufacture of the arrangement 200 with two all-around-gate transistors 201 are not individually shown and described here.

Since FIGS. 11-15 are intended to provide an illustration of an example of manufacturing of the arrangement 100, all of the descriptions provided above with respect to reference numerals indicated in FIGS. depicting the arrangement 100 (FIGS. 3-5) are applicable to FIGS. 11-15 and are not repeated. For the sake of consistency, the legend and patterns used in FIGS. 11-15 are the same as the legend and patterns used in FIGS. 3-5.

Although the particular manufacturing operations discussed below with reference to FIG. 10 are illustrated as manufacturing particular embodiments of the arrangements 100 and 200, these operations may be applied to manufacture many different embodiments of the arrangements 100 and 200, as discussed herein. Any of the elements discussed below with reference to FIGS. 10-15 may take the form of any of the embodiments of those elements discussed above (or otherwise disclosed herein).

At 1002 shown in FIG. 10, a channel material 114 (which may include one material in the channel portion 118 and another, blocking, material in the subfin 116) is provided over a substrate. The channel material provided at 1002 may take the form of any of the embodiments of the channel material 114 or 214 disclosed herein (e.g. any of the embodiments discussed herein with reference to the tri-gate transistors 101 or all-around-gate transistors 201). The channel material 114 or 214, shaped as the fin 112 or the wire 212, may be provided at 1002 using any suitable deposition and patterning techniques known in the art. For example, in various embodiments, a conventional subtractive technique may be employed in which a blanket III-V film stack is grown over, or transferred to, a working surface of a substrate. That blanket III-V film stack is then etched into fin cores. In alternative embodiments, a buffer of semiconductor material is first formed following any known techniques. In some embodiments, numerous islands of III-V or group IV material may be grown over a silicon substrate having a plurality of seeding surface regions. In some such embodiments, seeding surface regions may be surrounded by high aspect ratio sidewalls to practice aspect ratio trapping (ART) and achieve acceptable crystal quality in a heteroepitaxial buffer material. The ART technique is one example of local additive heteroepitaxial buffer fabrication, which may advantageously reduce the effects of lattice mismatch across various substrate/buffer heterojunctions. With ART, defects on {111} planes should terminate on STI sidewalls, lowering defect count in channel material on top.

FIG. 11 illustrates a cross-sectional view of an assembly 302 including a base 102 and a channel material 114 provided thereon, as a result of the process 1002 shown in the method 1000 of FIG. 10. In FIG. 11 and subsequent FIGS. different patterns are used to illustrate the channel portion 118 and in the subfin 116 of the fin 112. Although not shown in the assembly 302, providing the channel material 114 may also involve patterning of the channel material to form the fin 112 (the fin 112 not shown in FIG. 11 because FIG. 11 provides the view of the x-z plane, i.e. along the fin 112).

At 1004 shown in FIG. 10, a gate of a first future transistor is provided over a first part and a gate of a second future transistor is provided over a second part. The electrodes for the first and second transistors provided at 1004 may take the form of any of the embodiments of the tri-gate electrodes with the gate stack 106 disclosed herein (e.g. any of the embodiments discussed herein with reference to the tri-gate transistors 101) or any of the embodiments of the all-round-gate electrodes with the gate stack 206 disclosed herein (e.g. any of the embodiments discussed herein with reference to the all-around-gate transistors 201). The tri-gate or all-around-gate electrodes for the first and second transistors may be provided at 1004 using any suitable deposition and patterning techniques known in the art.

FIG. 12 illustrates a cross-sectional view of an assembly 304 including the tri-gate electrodes 108, with their respective gate dielectrics 110 and gate spacers 111, for the future first and second transistors 101, provided over the fin 112 as a result of process 1004 shown in the method 1000 of FIG. 10.

At 1006 shown in FIG. 10, a fixed charge dielectric material as described herein is provided in between the electrodes provided at 1004. The fixed charge dielectric material provided at 1006 may take the form of any of the embodiments of the fixed charge dielectric material 132 or 232 disclosed herein (e.g. any of the embodiments discussed herein with reference to the isolation structure 130 or 230). A positive fixed charge dielectric material 132/232 disposed at 1006 may be provided according to the method 2000 shown in FIG. 16, while a negative fixed charge dielectric material 132/232 disposed at 1006 may be provided according to the method 3000 shown in FIG. 17, both methods described below.

Figures 13, 14:
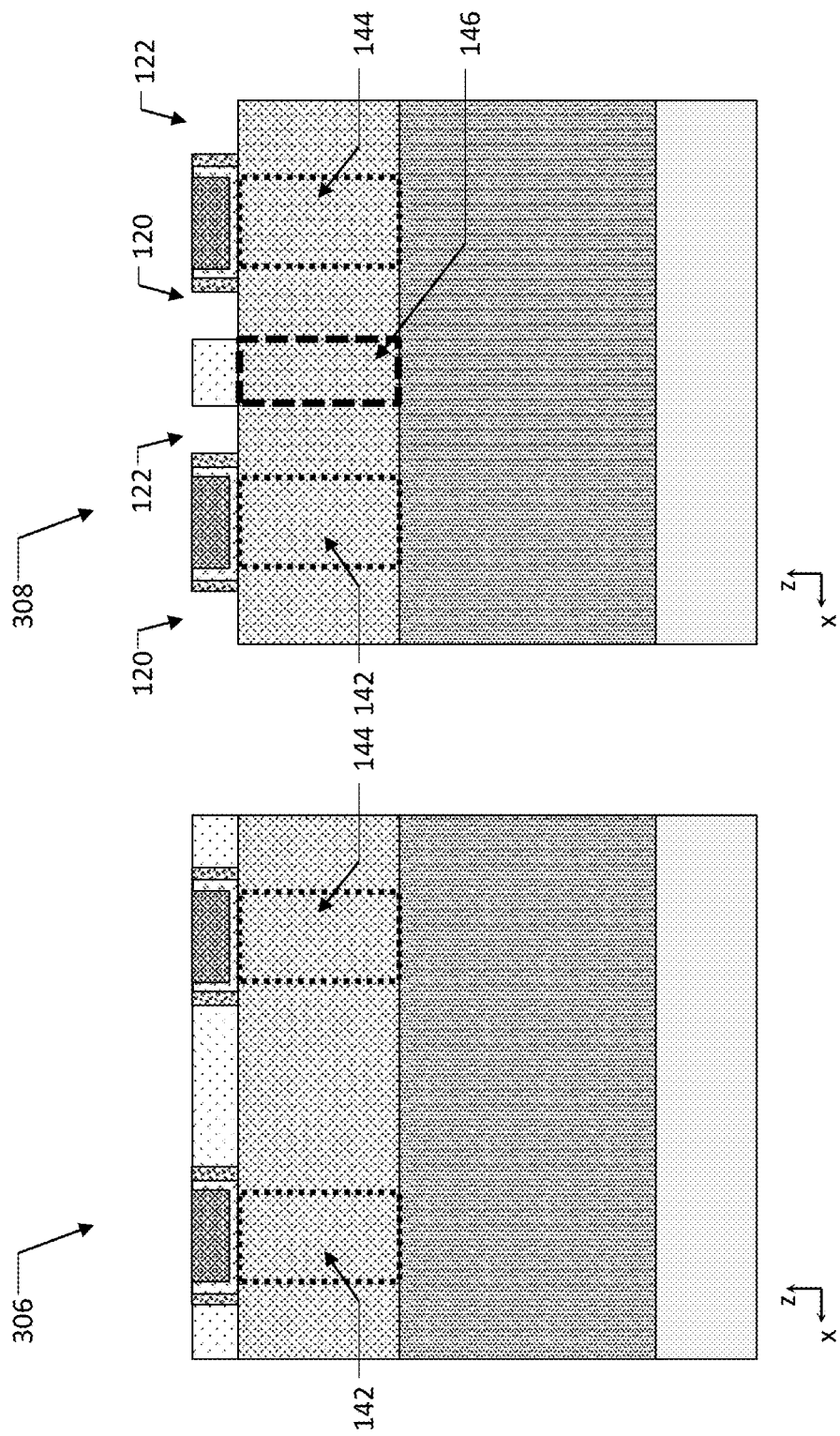

FIG. 13 illustrates a cross-sectional view of an assembly 306 including the fixed charge dielectric material 132 disposed in between the tri-gate gate spacers 111, as a result of process 1006 shown in the method 1000 of FIG. 10.

At 1008 shown in FIG. 10, the fixed charge dielectric material provided at 1006 is patterned to form an isolation structure between the drain of the first transistor and the source of the adjacent second transistor. The isolation structure provided at 1008 may take the form of any of the embodiments of the isolation structure 130 disclosed herein (e.g. any of the tri-gate arrangement embodiments discussed herein with reference to the first part 142, the second part 144, and the third part 146) or any of the embodiments of the isolation structure 230 disclosed herein (e.g. any of the all-around-gate arrangement embodiments discussed herein with reference to the first part 242, the second part 244, and the third part 246). The isolation structure 130/230 may be provided at 1008 using any suitable patterning technique known in the art.

FIG. 14 illustrates a cross-sectional view of an assembly 308 including the fixed charge dielectric material patterned to form an isolation structure between the drain of the first tri-gate transistor and the source of the adjacent tri-gate second transistor, a result of process 1008 shown in the method 1000 of FIG. 10.

At 1010 shown in FIG. 10, the source and drain regions for the first and second transistors are provided. The electrically conductive material provided at 1010 may take the form of any of the embodiments of the source/drain contact material 140 or 240 disclosed herein (e.g. any of the embodiments discussed herein with reference to the tri-gate transistors 101 or the all-around-gate transistors 201). The source/drain contact material 140/240 of the source and drain regions may be provided at 1010 using any suitable deposition and patterning techniques known in the art.

Figure 15:
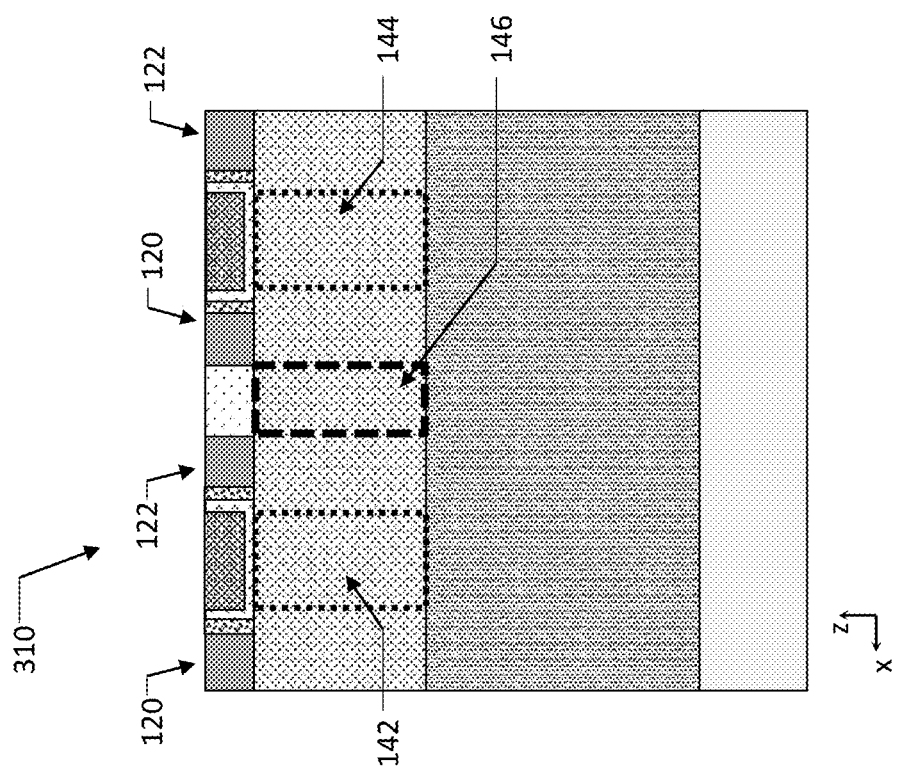

FIG. 15 illustrates a cross-sectional view of an assembly 310 including the source/drain contact material 140 provided over the source and the drain regions 120, 122 of the first and second tri-gate transistors, a result of process 1010 shown in the method 1000 of FIG. 10.

The method 1000 shown in FIG. 11 may further include other manufacturing operations related to fabrication of other components of the arrangements 100 or 200, or any devices that include such arrangements. For example, the method 1000 may various cleaning operations, surface planarization operations (e.g. using chemical mechanical polishing), operations to include barrier and/or adhesion layers as needed, and/or operations for incorporating the arrangement 100 or 200 in, or with, an IC component. In another example, if ART technique was used to form the tri-gate transistors, then the order and nature of steps for including in such a transistor the fixed charge dielectric structure as described herein may also change.

FIG. 16 is a flow diagram of an example method 2000 of providing a positive fixed charge dielectric of an isolation structure, in accordance with various embodiments. The method 2000 may be used to form a positive fixed charge dielectric material that can be used as the fixed charge dielectric material 132 or 232 described herein.

As described above, positive fixed charges can be created in a dielectric material having sufficiently large conduction band offset with respect to a channel material used (i.e. so that there is a sufficient number of unoccupied electron states of donor type in the fixed charge dielectric material 132/232 which are higher in energy than the bottom conduction band of the channel material 114/214). Therefore, the method 2000 may begin at 2002, with selecting a dielectric material having a sufficiently large conduction band offset from that of the semiconductor material selected as the channel material 114/214. In some embodiments, any dielectric material having a conduction band offset greater than 1 eV may be selected. In some embodiments, the dielectric material selected at 2002 has a conduction band offset greater than 2 eV, e.g. greater than 3 eV or greater than 4 eV. Sufficient conduction band offset between the selected dielectric and channel materials ensures that, by applying the growth processing of the selected dielectric material as described below, positive fixed charge can be incorporated into the dielectric material. Dielectric materials that could be used for forming positive fixed charge dielectric materials include, but are not limited to oxides (ex. beryllium oxide, magnesium oxide, aluminum oxide, hafnium oxide, zirconium oxide, lanthanum oxide, yttrium oxide, scandium oxide, gadolinium oxide, etc.), nitrides (ex. boron nitride, aluminum nitride, silicon nitride, etc.), carbides (wide-bandgap polytypes of silicon carbide, ex. 2H and 4H, etc.), and silicates (ex. hafnium silicate, zirconium silicate, etc.).

At 2004, the method 2000 may proceed with the deposition of the selected dielectric material, e.g. using CDV or ALD, under deposition conditions that promote incorporation of positive fixed charges in the dielectric material being grown.

In general, CVD or ALD is a chemical process in which one or more reactive precursor gases are introduced into a reaction chamber and directed towards a substrate in order to induce controlled chemical reactions that result in growth of a desired material on the substrate. The one or more reactive gases may be provided to the chamber at a flow rate of e.g. 5 standard cubic centimeter per minute (sccm) to 500 sccm, including all values and ranges therein. The reactive gas may be provided with a carrier gas, such as an inert gas, which may include, for example, argon. In some embodiments, the chamber may be maintained at a pressure in the range of 1 milliTorr to 100 milliTorr, including all values and ranges therein, and a temperature in the range of 100° C. to 500° C., including all values and ranges therein. The substrate itself may also be heated. In some embodiments, the process may be plasma assisted where electrodes are provided within the process chamber and are used to ionize the gases. Alternatively, plasma may be formed outside of the chamber and then supplied into the chamber. In the chamber, a layer of solid thin film material is deposited on the surface of the substrate due to reaction of the gas/gasses.

In process 2004, the substrate placed in the CVD or ALD reaction chamber may be e.g. the assembly 304 shown in FIG. 12 or an analogous assembly for all-around-gate transistor embodiments (i.e. an assembly of a substrate with a channel material, formed either as a fin or as a wire, and gates provided thereon). The layer of solid thin film material deposited on the surface of such a substrate due to reaction of precursor gasses in the reaction chamber is the layer of the positive fixed charge dielectric material as described herein. A selection of particular one or more precursor gases used in process 2004 would depend on the dielectric material selected in process 2002. Deposition conditions that promote incorporation of positive fixed charges, e.g. in the form of native point defects or/and impurities, may include providing cation-rich environment in the reaction chamber, doping of the dielectric material being grown with positively charged impurity atoms, and adding negatively charged hydrogen atoms to the reaction chamber (i.e. providing hydrogen ambient growth).

In some embodiments, providing cation-rich growth conditions may include ensuring that the partial pressure of cation-precursor species in the reaction chamber is at or above a certain threshold, the threshold being provided either as an absolute value or a value relative to partial pressure of other gasses in the chamber, e.g. of the anion-precursor gases. In some embodiments, establishing cation-rich growth conditions may include ensuring that the partial pressure of the cation precursor gas/gases is greater than the partial pressure of the anion precursor gases. For example, the partial pressure of the cation precursor gas/gases may be between one and hundred times greater than the partial pressure of the anion precursor gases, including all values and ranges therein. For deposition of the positive fixed charge dielectric layer as described herein, the cation precursor gases may include one or more metal-containing precursors bound by a non-metallic element such as e.g. chlorine, fluorine, bromine, iodine, etc. For example, in some embodiments, the cation precursors may include metal-containing precursors such as beryllium chloride, magnesium chloride, aluminum chloride, hafnium chloride, zirconium chloride, lanthanum chloride, yttrium chloride, scandium chloride, gadolimium chloride, and analogous metal-based precursors bound by fluorine, bromine, iodine, etc. In other embodiments, the cation precursors may include metal-based carbon/hydrogen containing precursors, including but not limited to metal-containing amidinates and actinates.

Doping with impurity atoms that lead to positive fixed charge may be performed by in-situ doping during the CVD or ALD growth of the fixed charge layer. Impurity atoms that lead to positive fixed charge can be incorporated into the dielectric material being grown through introduction of impurity-level quantities of dopant-containing precursor gases during the growth, and controlled through the partial pressure of such gasses. When the selected dielectric material is an oxide or a silicate, suitable dopant atoms to be provided in a dopant-containing precursor gas in process 2004 may include, but are not limited to fluorine, chlorine, bromine, etc (i.e. halogens). When the selected dielectric material is a nitride, suitable dopant atoms to be provided in a dopant-containing precursor gas in process 2004 may include, but are not limited to oxygen, sulfur, selenium, etc (i.e. elements from the oxygen group of the periodic table). When the selected dielectric material is a carbide, suitable dopant atoms to be provided in a dopant-containing precursor gas in process 2004 may include, but are not limited to nitrogen, phosphorus, arsenic, etc. (i.e. elements from the nitrogen group of the periodic table).

Providing the hydrogen ambient growth in process 2004 may be performed by incorporating atomic hydrogen into the dielectric material during growth. This is can be done by providing a negatively charged hydrogen ambient during growth (ex. hydrogen gas, PE-atomic hydrogen, water, etc.). The amphoteric nature of atomic hydrogen will allow it to cancel out the charge of intentionally incorporated positively charged defects and impurities. This hydrogen-induced charge stabilization may lead to more favorable conditions for incorporation of positively charged defects and impurities, as they are neutralized by atomic hydrogen.

After the deposition of the dielectric material is finished, the deposited dielectric material layer is annealed, at 2006, in order to drive the incorporated negative hydrogen atoms away from the deposited dielectric material, leaving behind positive fixed charges. For example, annealing may be carried out by heating up the substrate to 200-600 degrees Celsius, for 1-120 minutes. Dielectric materials having their oxygen coordination being equal to or greater than four will be more suitable for the application of this hydrogen strategy for incorporation of positive fixed charge, including, but not limited to beryllium oxide, magnesium oxide, boron nitride, aluminum nitride, silicon carbide, etc.

FIG. 17 is a flow diagram of an example method 3000 of providing a negative fixed charge dielectric of an isolation structure, in accordance with various embodiments. The method 3000 may be used to form a negative fixed charge dielectric material that can be used as the fixed charge dielectric material 132 or 232 described herein.

As described above, negative fixed charges can be created in a dielectric material having sufficiently large valence band offset with respect to a channel material used (i.e. so that there is a sufficient number of occupied electron states of acceptor type in the fixed charge dielectric material 132/232 which are lower in energy than the top valence band of the channel material 114/214). Therefore, the method 3000 may begin at 3002, with selecting a dielectric material having a sufficiently large valence band offset from that of the semiconductor material selected as the channel material 114/214. In some embodiments, any dielectric material having a valence band offset greater than zero may be selected. In some embodiments, the dielectric material selected at 3002 has a valence band offset greater than 1 eV, e.g. greater than 2 eV or greater than 3 eV. Sufficient valence band offset between the selected dielectric and channel materials ensures that, by applying the growth processing of the selected dielectric material as described below, negative fixed charge can be incorporated into the dielectric material. Dielectric materials that could be used for forming negative fixed charge dielectric materials include, but are not limited to oxides (ex. beryllium oxide, magnesium oxide, aluminum oxide, hafnium oxide, zirconium oxide, lanthanum oxide, yttrium oxide, scandium oxide, gadolinium oxide, etc.), nitrides (ex. boron nitride, aluminum nitride, silicon nitride, etc.), carbides (wide-band-gap polytypes of silicon carbide, ex. 2H and 4H, etc.), and silicates (ex. hafnium silicate, zirconium silicate, etc.).

At 3004, the method 3000 may proceed with the deposition of the selected dielectric material, e.g. using CDV or ALD, under deposition conditions that promote incorporation of negative fixed charges in the dielectric material being grown.

In process 3004, the substrate placed in the CVD or ALD reaction chamber may be e.g. the assembly 304 shown in FIG. 12 or an analogous assembly for all-around-gate transistor embodiments (i.e. an assembly of a substrate with a channel material, formed either as a fin or as a wire, and gates provided thereon). The layer of solid thin film material deposited on the surface of such a substrate due to reaction of gasses in the reaction chamber is the layer of the negative fixed charge dielectric material as described herein. A selection of particular one or more anion precursor gases would depend on the dielectric material selected in process 3002. Deposition conditions that promote incorporation of negative fixed charges, e.g. in the form of native point defects or/and impurities, may include providing anion-rich environment in the reaction chamber, doping of the dielectric material being grown with negatively charged impurity atoms, and adding positively charged hydrogen atoms to the reaction chamber (i.e. providing hydrogen ambient growth).

In some embodiments, providing anion-rich growth conditions may include ensuring that the partial pressure of anion-precursor species in the reaction chamber is at or above a certain threshold, the threshold being provided either as an absolute value or a value relative to partial pressure of other gasses in the chamber, e.g. of the cation-precursor gases. In some embodiments, establishing anion-rich growth conditions may include ensuring that the partial pressure of the anion precursor gas/gases is greater than the partial pressure of the cation precursor gases. For example, the partial pressure of the anion precursor gas/gases may be between one and hundred times greater than the partial pressure of the cation precursor gases, including all values and ranges therein. For deposition of the negative fixed charge dielectric layer as described herein, the anion precursor gases may include one or more of oxygen-containing precursors (e.g. oxygen gas, water, hydrogen peroxide, etc.), nitrogen-containing precursors (e.g. nitrogen gas, ammonia, nitrous oxide, etc.), or carbon-containing precursors (e.g. carbon dioxide, carbon monoxide, methane, etc.).

Doping with impurity atoms that lead to negative fixed charge may be performed by in-situ doping during the CVD or ALD growth of the fixed charge layer. Impurity atoms that lead to negative fixed charge can be incorporated into the dielectric material being grown through introduction of impurity-level quantities of dopant-containing precursor gases during the growth, and controlled through the partial pressure of such gasses. When the selected dielectric material is an oxide or a silicate, suitable dopant atoms to be provided in a dopant-containing precursor gas in process 3004 may include, but are not limited to nitrogen, phosphorus, arsenic, etc (i.e. elements from the nitrogen group of the periodic table). When the selected dielectric material is a nitride, suitable dopant atoms to be provided in a dopant-containing precursor gas in process 3004 may include, but are not limited to carbon, silicon, germanium, etc (i.e. elements from the carbon group of the periodic table). When the selected dielectric material is a carbide, suitable dopant atoms to be provided in a dopant-containing precursor gas in process 3004 may include, but are not limited to boron, aluminum, gallium, etc (i.e. elements from the boron group of the periodic table).

Providing the hydrogen ambient growth in process 3004 may be performed by incorporating atomic hydrogen into the dielectric material during growth. This is can be done by providing a positively charged hydrogen ambient during growth (ex. hydrogen gas, PE-atomic hydrogen, water, etc.). The amphoteric nature of atomic hydrogen will allow it to cancel out the charge of intentionally incorporated negatively charged defects and impurities. This hydrogen-induced charge stabilization may lead to more favorable conditions for incorporation of negatively charged defects and impurities, as they are neutralized by atomic hydrogen.

After the deposition of the dielectric material is finished, the deposited dielectric material layer is annealed, at 3006, in order to drive the incorporated positive hydrogen atoms away from the deposited dielectric material, leaving behind negative fixed charges. For example, annealing may be carried out by heating up the substrate to 200-600 degrees Celsius, for 1-120 minutes.

The tri-gate and all-around-gate arrangements disclosed herein may be included in any suitable electronic device. FIGS. 18-21 illustrate various examples of apparatuses that may include one or more of the tri-gate and all-around-gate arrangements with isolations structures disclosed herein.

Figure 18A:
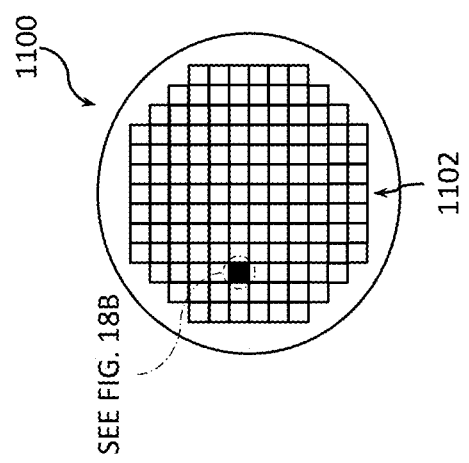
FIGS. 18A and 18B are top views of a wafer and dies that include one or more arrangements with two tri-gate or all-around-gate transistors isolated by a fixed charge isolation structure in accordance with any of the embodiments disclosed herein.
Figure 18B:
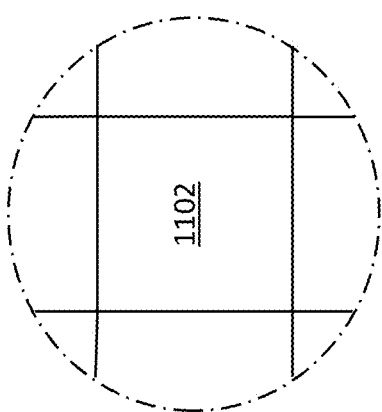

FIGS. 18A-B are top views of a wafer 1100 and dies 1102 that may include one or more tri-gate and all-around-gate arrangements with device isolation structures in accordance with any of the embodiments disclosed herein. The wafer 1100 may be composed of semiconductor material and may include one or more dies 1102 having IC structures formed on a surface of the wafer 1100. Each of the dies 1102 may be a repeating unit of a semiconductor product that includes any suitable IC (e.g., ICs including arrangements 100/200 that include two or more tri-gate and all-around-gate transistors 101/201 with a respective device isolation structure 130/230 provided between at least some pairs of adjacent transistors). After the fabrication of the semiconductor product is complete (e.g., after manufacture of an arrangement 100/200 with two or more transistors 101/201 separated by device isolation structures 130/230), the wafer 1100 may undergo a singulation process in which each of the dies 1102 is separated from one another to provide discrete "chips" of the semiconductor product. In particular, devices that include a tri-gate or an all-around-gate transistor arrangements with isolation structures as disclosed herein may take the form of the wafer 1100 (e.g., not singulated) or the form of the die 1102 (e.g., singulated). The die 1102 may include two or more transistors (e.g., two or more of the transistors 1240 of FIG. 19, discussed below) separated by one or more fixed charge isolation structures, which may take the form of any of the transistors 101/201 and the isolation structures 130/230 in the arrangement 100/200, and/or supporting circuitry to route electrical signals to the transistors, as well as any other IC components. In some embodiments, the wafer 1100 or the die 1102 may include a memory device (e.g., a static random access memory (SRAM) device), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 1402 of FIG. 21) or other logic that is configured to store information in the memory devices or execute instructions stored in the memory array.

Figure 19:
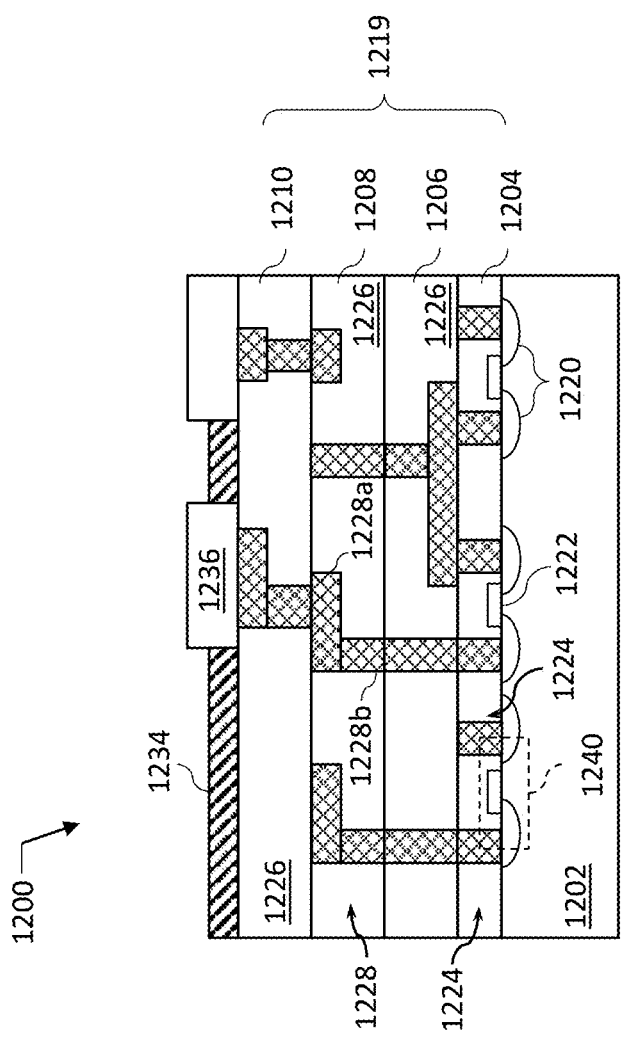
FIG. 19 is a cross-sectional side view of an integrated circuit (IC) device that may include one or more arrangements with two tri-gate or all-around-gate transistors isolated by a fixed charge isolation structure in accordance with any of the embodiments disclosed herein.

FIG. 19 is a cross-sectional side view of an IC device 1200 that may include one or more tri-gate and all-around-gate arrangements with fixed charge device isolation structures in accordance with any of the embodiments disclosed herein. The IC device 1200 may be formed on a substrate 1202 (e.g., the wafer 1100 of FIG. 18A) and may be included in a die (e.g., the die 1102 of FIG. 18B). The substrate 1202 may be a semiconductor substrate composed of semiconductor material systems including, for example, N-type or P-type materials systems. The substrate 1202 may include, for example, a crystalline substrate formed using a bulk silicon or a silicon-on-insulator substructure. In some embodiments, the semiconductor substrate 1202 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 1202. Although a few examples of materials from which the substrate 1202 may be formed are described here, any material that may serve as a foundation for an IC device 1200 may be used. The substrate 1202 may be part of a singulated die (e.g., the dies 1102 of FIG. 18B) or a wafer (e.g., the wafer 1100 of FIG. 18A).

The IC device 1200 may include one or more device layers 1204 disposed on the substrate 1202. The device layer 1204 may include features of one or more transistors 1240 (e.g., metal oxide semiconductor field-effect transistors (MOSFETs)) formed on the substrate 1202. The device layer 1204 may include, for example, one or more source and/or drain (S/D) regions 1220, a gate 1222 to control current flow in the transistors 1240 between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 19 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors. In particular, two or more of the transistors 1240 may be arranged in one or more tri-gate and all-around-gate arrangements with device isolation structures 130/230 in accordance with any of the embodiments disclosed herein. The S/D regions 1220 may include the source region 120 and the drain region 122 as described above. Transistors arranged in one or more tri-gate and all-around-gate arrangements with device isolation structures 130/230 may be particularly advantageous when used in the metal layers of a microprocessor device for analog circuitry, logic circuitry, or memory circuitry, and may be formed along with existing complementary metal oxide semiconductor (CMOS) processes.

Each transistor 1240 may include a gate 1222 formed of at least two layers, a gate dielectric layer and a gate electrode layer. The gate electrode layer may take the form of any of the embodiments of the gate electrode material 108/208 disclosed herein. Generally, the gate dielectric layer of a transistor 1240 may include one layer or a stack of layers, and the one or more layers may include silicon oxide, silicon dioxide, and/or a high-k dielectric material. The high-k dielectric material included in the gate dielectric layer of the transistor 1240 may take the form of any of the embodiments of the high-k dielectric 110 disclosed herein, for example.

In some embodiments, when viewed as a cross section of the transistor 1240 along the source-channel-drain direction, the gate electrode may consist of a U-shaped structure that includes a bottom portion substantially parallel to the surface of the substrate and two sidewall portions that are substantially perpendicular to the top surface of the substrate (e.g., as discussed above with reference to the tri-gate transistor 101 of FIGS. 1 and 3-5). In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers. In some embodiments, the gate electrode may consist of a V-shaped structure (e.g., when the fin 112 does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1220 may be formed adjacent to the gate 1222 of each transistor 1240. The S/D regions 1220 may take the form of any of the embodiments of the source region 120/220 and the drain region 122/222 discussed above with reference to the transistors 101/201. In other embodiments, the S/D regions 1220 may be formed using any suitable processes known in the art. For example, the S/D regions 1220 may be formed using either an implantation/diffusion process or a deposition process. In the former process, dopants such as boron, aluminum, antimony, phosphorous, or arsenic may be ion-implanted into the substrate 1202 to form the S/D regions 1220. An annealing process that activates the dopants and causes them to diffuse farther into the substrate 1202 may follow the ion implantation process. In various embodiments, the S/D regions 1220 can be created by either ion implantation into the fin (for the tri-gate architectures) or the wire (for the all-around-gate architectures), or in-situ doping in an epitaxial deposition followed by an S/D etch of the fin or the wire, or a combination of both. In the latter process, an epitaxial deposition process may provide material that is used to fabricate the S/D regions 1220. In some implementations, the S/D regions 1220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1220 may be formed using one or more alternate semiconductor materials such as germanium or a group III-V material or alloy. In further embodiments, one or more layers of metal and/or metal alloys may be used to form the S/D regions 1220 (e.g., as discussed above with reference to the source region 120 and the drain region 122). In some embodiments, an etch process may be performed before the epitaxial deposition to create recesses in the substrate 1202 in which the material for the S/D regions 1220 is deposited.

Electrical signals, such as power and/or input/output (I/O) signals, may be routed to and/or from the transistors 1240 of the device layer 1204 through one or more interconnect layers disposed on the device layer 1204 (illustrated in FIG. 19 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1210. The one or more interconnect layers 1206-1210 may form an interlayer dielectric (ILD) stack 1219 of the IC device 1200.

The interconnect structures 1228 may be arranged within the interconnect layers 1206-1210 to route electrical signals according to a wide variety of designs (in particular, the arrangement is not limited to the particular configuration of interconnect structures 1228 depicted in FIG. 19). Although a particular number of interconnect layers 1206-1210 is depicted in FIG. 19, embodiments of the present disclosure include IC devices having more or fewer interconnect layers than depicted.

In some embodiments, the interconnect structures 1228 may include trench structures 1228a (sometimes referred to as "lines") and/or via structures 1228b (sometimes referred to as "holes") filled with an electrically conductive material such as a metal. The trench structures 1228a may be arranged to route electrical signals in a direction of a plane that is substantially parallel with a surface of the substrate 1202 upon which the device layer 1204 is formed. For example, the trench structures 1228a may route electrical signals in a direction in and out of the page from the perspective of FIG. 19. The via structures 1228b may be arranged to route electrical signals in a direction of a plane that is substantially perpendicular to the surface of the substrate 1202 upon which the device layer 1204 is formed. In some embodiments, the via structures 1228b may electrically couple trench structures 1228a of different interconnect layers 1206-1210 together.

The interconnect layers 1206-1210 may include a dielectric material 1226 disposed between the interconnect structures 1228, as shown in FIG. 19. In some embodiments, the dielectric material 1226 disposed between the interconnect structures 1228 in different ones of the interconnect layers 1206-1210 may have different compositions; in other embodiments, the composition of the dielectric material 1226 between different interconnect layers 1206-1210 may be the same.

A first interconnect layer 1206 (referred to as Metal 1 or "M1") may be formed directly on the device layer 1204. In some embodiments, the first interconnect layer 1206 may include trench structures 1228a and/or via structures 1228b, as shown. The trench structures 1228a of the first interconnect layer 1206 may be coupled with contacts (e.g., the S/D contacts 1224) of the device layer 1204.

A second interconnect layer 1208 (referred to as Metal 2 or "M2") may be formed directly on the first interconnect layer 1206. In some embodiments, the second interconnect layer 1208 may include via structures 1228b to couple the trench structures 1228a of the second interconnect layer 1208 with the trench structures 1228a of the first interconnect layer 1206. Although the trench structures 1228a and the via structures 1228b are structurally delineated with a line within each interconnect layer (e.g., within the second interconnect layer 1208) for the sake of clarity, the trench structures 1228a and the via structures 1228b may be structurally and/or materially contiguous (e.g., simultaneously filled during a dual-damascene process) in some embodiments.

A third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206.

The IC device 1200 may include a solder resist material 1234 (e.g., polyimide or similar material) and one or more bond pads 1236 formed on the interconnect layers 1206-1210. The bond pads 1236 may be electrically coupled with the interconnect structures 1228 and configured to route the electrical signals of the transistor(s) 1240 to other external devices. For example, solder bonds may be formed on the one or more bond pads 1236 to mechanically and/or electrically couple a chip including the IC device 1200 with another component (e.g., a circuit board). The IC device 1200 may have other alternative configurations to route the electrical signals from the interconnect layers 1206-1210 than depicted in other embodiments. For example, the bond pads 1236 may be replaced by or may further include other analogous features (e.g., posts) that route the electrical signals to external components.

Figure 20:
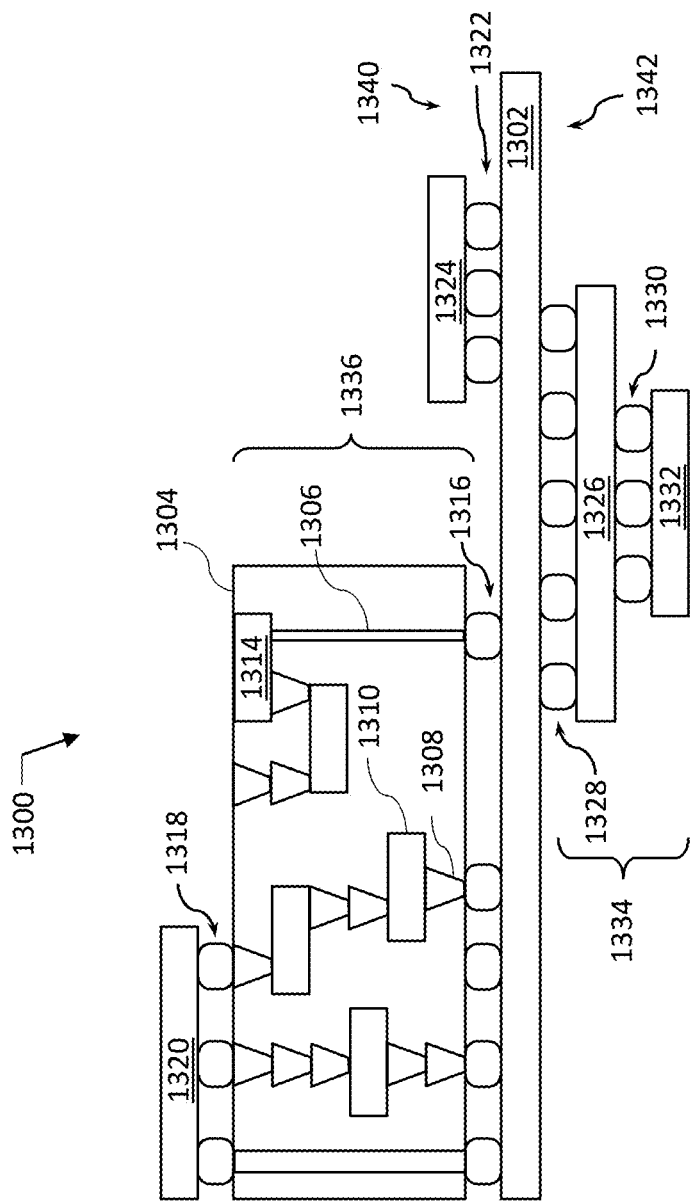
FIG. 20 is a cross-sectional side view of an IC device assembly that may include one or more arrangements with two tri-gate or all-around-gate transistors isolated by a fixed charge isolation structure in accordance with any of the embodiments disclosed herein.

FIG. 20 is a cross-sectional side view of an IC device assembly 1300 that may include components having one or more tri-gate and all-around-gate arrangements with device isolation structures in accordance with any of the embodiments disclosed herein. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302; generally, components may be disposed on one or both faces 1340 and 1342. In particular, any suitable ones of the components of the IC device assembly 1300 may include any of the tri-gate and all-around-gate arrangements 100/200 with device isolation structures disclosed herein (e.g., including in any of the transistors 101/201 and isolation structures 130/230 disclosed herein).

In some embodiments, the circuit board 1302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 20 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 20), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 20, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1102 of FIG. 18B), an IC device (e.g., the IC device 1200 of FIG. 19), or any other suitable component. Generally, the interposer 1304 may spread a connection to a wider pitch or reroute a connection to a different connection. For example, the interposer 1304 may couple the IC package 1320 (e.g., a die) to a ball grid array (BGA) of the coupling components 1316 for coupling to the circuit board 1302. In the embodiment illustrated in FIG. 20, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

The interposer 1304 may be formed of an epoxy resin, a fiberglass-reinforced epoxy resin, a ceramic material, or a polymer material such as polyimide. In some implementations, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to through-silicon vias (TSVs) 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 20 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 21:
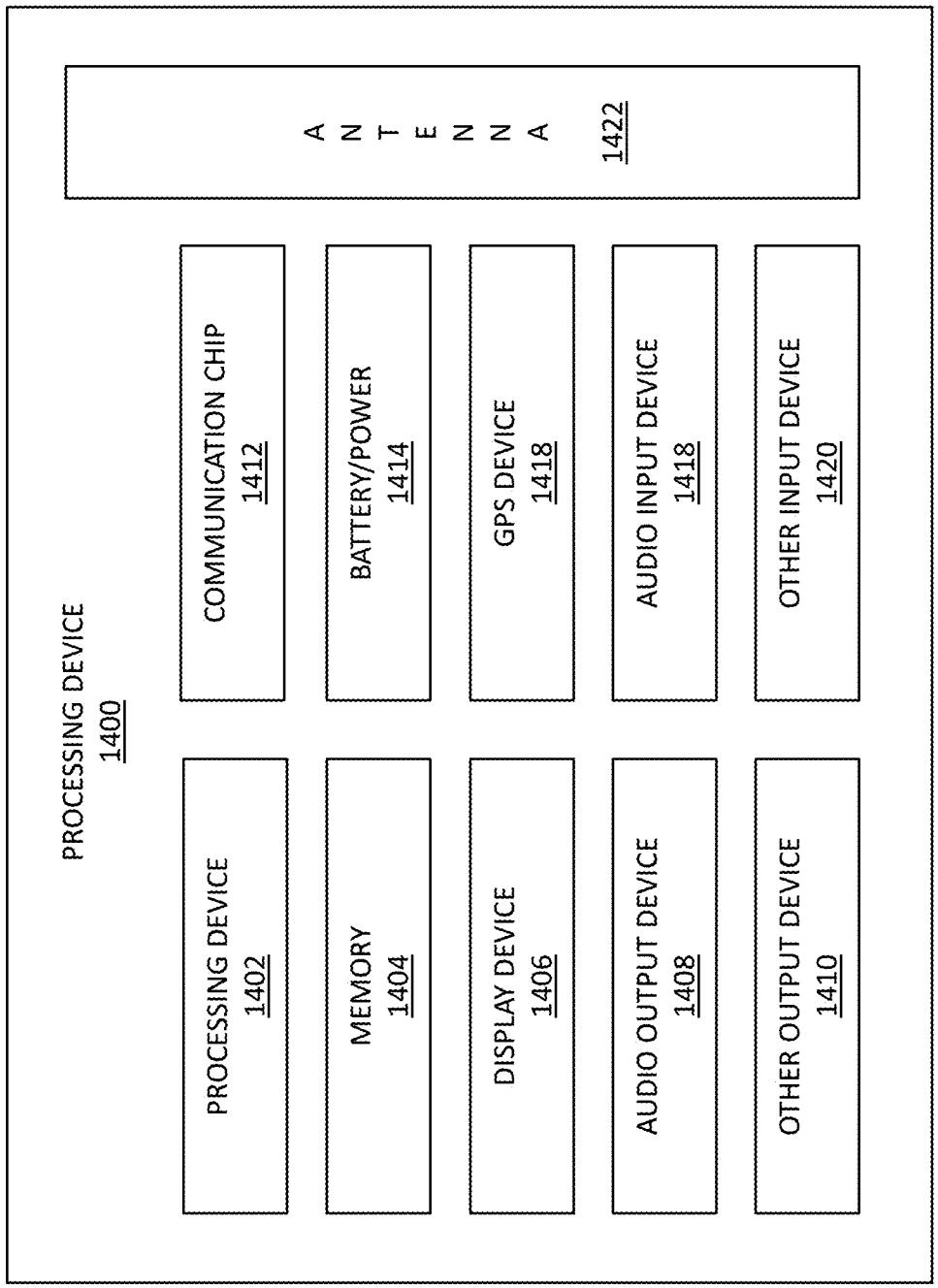
FIG. 21 is a block diagram of an example computing device that may include one or more arrangements with two tri-gate or all-around-gate transistors isolated by a fixed charge isolation structure in accordance with any of the embodiments disclosed herein.

FIG. 21 is a block diagram of an example computing device 1400 that may include one or more components including one or more tri-gate and all-around-gate arrangements with device isolation structures in accordance with any of the embodiments disclosed herein. For example, any suitable ones of the components of the computing device 1400 may include a die (e.g., the die 1102 (FIG. 18B)) having two or more transistors 101/201 includes in one or more tri-gate and all-around-gate arrangements 100/200 with device isolation structures 130/230. Any one or more of the components of the computing device 1400 may include, or be included in, an IC device 1200 (FIG. 19). Any one or more of the components of the computing device 1400 may include, or be included in, an IC device assembly 1300 (FIG. 20).

A number of components are illustrated in FIG. 21 as included in the computing device 1400, but any one or more of these components may be omitted or duplicated, as suitable for the application. In some embodiments, some or all of the components included in the computing device 1400 may be attached to one or more motherboards. In some embodiments, some or all of these components are fabricated onto a single system-on-a-chip (SoC) die.

Additionally, in various embodiments, the computing device 1400 may not include one or more of the components illustrated in FIG. 21, but the computing device 1400 may include interface circuitry for coupling to the one or more components. For example, the computing device 1400 may not include a display device 1406, but may include display device interface circuitry (e.g., a connector and driver circuitry) to which a display device 1406 may be coupled. In another set of examples, the computing device 1400 may not include an audio input device 1424 or an audio output device 1408, but may include audio input or output device interface circuitry (e.g., connectors and supporting circuitry) to which an audio input device 1424 or audio output device 1408 may be coupled.

The computing device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random-access memory (STT-M RAM).

In some embodiments, the computing device 1400 may include a communication chip 1412 (e.g., one or more communication chips). For example, the communication chip 1412 may be configured for managing wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The computing device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as GPS, EDGE, GPRS, CDMA, WiMAX, LTE, EV-DO, or others. In some embodiments, a first communication chip 1412 may be dedicated to wireless communications, and a second communication chip 1412 may be dedicated to wired communications.

The computing device 1400 may include battery/power circuitry 1414. The battery/power circuitry 1414 may include one or more energy storage devices (e.g., batteries or capacitors) and/or circuitry for coupling components of the computing device 1400 to an energy source separate from the computing device 1400 (e.g., AC line power).

The computing device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display, for example.

The computing device 1400 may include an audio output device 1408 (or corresponding interface circuitry, as discussed above). The audio output device 1408 may include any device that generates an audible indicator, such as speakers, headsets, or earbuds, for example.

The computing device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The computing device 1400 may include a global positioning system (GPS) device 1418 (or corresponding interface circuitry, as discussed above). The GPS device 1418 may be in communication with a satellite-based system and may receive a location of the computing device 1400, as known in the art.

The computing device 1400 may include an other output device 1410 (or corresponding interface circuitry, as discussed above). Examples of the other output device 1410 may include an audio codec, a video codec, a printer, a wired or wireless transmitter for providing information to other devices, or an additional storage device.

The computing device 1400 may include an other input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1400 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1400 may be any other electronic device that processes data.

The following paragraphs provide various examples of the embodiments disclosed herein.

Example 1 provides a transistor arrangement that includes a channel material disposed over a substrate; a gate electrode of a first transistor, the gate electrode of the first transistor disposed over a first part of the channel material; a gate electrode of a second transistor, the gate electrode of the second transistor disposed over a second part of the channel material; and an isolation structure disposed over a third part of the channel material, the third part being between the first part and the second part of the channel material, the isolation structure including a fixed charge dielectric material.

Example 2 provides the transistor arrangement according to Example 1, where the fixed charge dielectric material includes a dielectric material having a concentration of fixed charges greater than $5^{12}$ per square centimeter.

Example 3 provides the transistor arrangement according to Example 2, where the fixed charges are positive fixed charges when the channel material is a P-type material (i.e. when the first and second transistors are PMOS transistors).

Example 4 provides the transistor arrangement according to Example 2, where the fixed charges are negative fixed charges when the channel material is an N-type material (i.e. when the first and second transistors are NMOS transistors).

Example 5 provides the transistor arrangement according to any one of the preceding Examples, where a smallest distance between a source region or a drain region of the first transistor and a source region or a drain region of the second transistor is less than a channel length of the first and the second transistors. Thus, the closest source/drain terminals of the first and second transistors are provided at less than a single poly-pitch from one another, enabling more compact multiple transistor arrangements.

Example 6 provides the transistor arrangement according to any one of the preceding Examples, where the fixed charge dielectric material has a thickness, as measured between a pair of closest terminals of the first and second transistors, between 5 nanometers and 20 nanometers.

Example 7 provides the transistor arrangement according to any one of the preceding Examples, where a distance between the first part and the second part is between 20 nanometers and 60 nanometers.

Example 8 provides a multiple transistor device, including a channel material disposed over a substrate; a first transistor having a source region, a drain region, and a first gate, the first gate disposed over a first part of the channel material; a second transistor having a source region, a drain region, and a second gate, the second gate disposed over a second part of the channel material; and an isolation structure disposed over a third part of the channel material, the third part being between the first part and the second part of the channel material, the isolation structure including a fixed charge dielectric material.

Example 9 provides the multiple transistor device according to Example 8, where the channel material is shaped as a fin extending away from a base, the fin including a first portion and a second portion, the first portion being closer to the base than the second portion, and each of the first gate, the second gate, and the isolation structure wraps around the second portion of the fin. Thus, each of the first gate, the second gate, and the isolation structure wraps around the upper portion of the fin where the channels of the first and second transistors are. In various embodiments, the fin may have a height between 30 and 350 nanometers, e.g. between 30 and 200 nanometers, or between 50 and 200 nanometers.

Example 10 provides the multiple transistor device according to Example 9, where the fixed charge dielectric material is a liner that wraps around the second portion of the fin, the liner having a thickness between 2 and 5 nanometers.

Example 11 provides the multiple transistor device according to Example 8, where the channel material is shaped as a wire, and each of the first gate, the second gate, and the isolation structure wraps entirely around the wire.

Example 12 provides the multiple transistor device according to Example 11, where the fixed charge dielectric material is a liner that wraps entirely around the wire, the liner having a thickness between 2 and 5 nanometers.

Example 13 provides the multiple transistor device according to any one of Examples 8-12, where the fixed charge dielectric material includes a dielectric material having a concentration of fixed charges greater than $5^{12}$ per square centimeter.

Example 14 provides the multiple transistor device according to Example 13, where the fixed charges are positive fixed charges when the first and second transistors are PMOS transistors, and the fixed charges are negative fixed charges when the first and second transistors are NMOS transistors.

Example 15 provides the multiple transistor device according to any one of Examples 8-14, where each of the first gate and the second gate has a gate length, along the fin or along the wire, between 20 and 40 nanometers, preferably between 20 and 30 nanometers.

Example 16 provides a computing device, including a substrate; and an integrated circuit (IC) die coupled to the substrate, where the IC die includes a first transistor and a second transistor sharing a continuous channel material, the first transistor having a first gate disposed over a first part of the channel material and the second transistor having a second gate disposed over a second part of the channel material, and the IC die further includes an isolation structure disposed over a third part of the channel material, the third part being between the first part and the second part of the channel material, the isolation structure including a fixed charge dielectric material.

Example 17 provides the computing device of Example 16, where the computing device is a wearable or handheld computing device.

Example 18 provides the computing device of any one of Examples 16-17, where the computing device further includes one or more communication chips and an antenna.

Example 19 provides the computing device of any one of Examples 16-17, where the substrate is a motherboard.

Example 20 provides a method of manufacturing a multiple transistor device, including providing a channel material over a substrate; providing a first gate over a first part of the channel material; providing a second gate over a second part of the channel material; providing an isolation structure over a third part of the channel material, the third part being between the first part and the second part of the channel material, the isolation structure including a fixed charge dielectric material.

Example 21 provides the method according to Example 20, where providing the isolation structure includes performing atomic layer deposition, physical vapor deposition, or chemical vapor deposition of the fixed charge dielectric material and patterning of the fixed charge dielectric material.

Example 22 provides the method according to Examples 20 or 21, where providing the channel material includes providing the channel material shaped as a fin extending away from the substrate.

Example 23 provides the method according to Examples 20 or 21, where providing the channel material includes providing the channel material shaped as a wire, and where each of the first gate, the second gate, and the isolation structure wraps entirely around the wire.

Example 24 provides the method according to any one of Examples 20-23, further including providing a gate dielectric material disposed between the channel material and each of the first gate and the second gate.

Example 25 provides the method according to any one of Examples 20-24, further including, for each of the first and second transistors, providing a source region and a drain region spaced apart by a gate length between 20 and 40 nanometers, preferably between 20 and 30 nanometers.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. A transistor arrangement, comprising:
a channel material over a substrate;
a gate electrode of a first transistor over a first portion of the channel material;
a gate electrode of a second transistor over a second portion of the channel material; and
an isolation structure over a third portion of the channel material, the third portion being between the first portion and the second portion of the channel material, the isolation structure comprising a fixed charge dielectric material,
wherein:
the fixed charge dielectric material includes a dielectric material having fixed charges,
the fixed charges are positive fixed charges when the channel material is a P-type material, and
the fixed charges are negative fixed charges when the channel material is an N-type material.

2. The transistor arrangement according to claim 1, wherein the fixed charge dielectric material comprises a dielectric material having a concentration of fixed charges greater than $10^{12}$ fixed charges per square centimeter.

3. The transistor arrangement according to claim 1, wherein a smallest distance between a source region or a drain region of the first transistor and a source region or a drain region of the second transistor is less than a channel length of the first and the second transistors.

4. The transistor arrangement according to claim 1, wherein the fixed charge dielectric material has a thickness between 5 nanometers and 20 nanometers.

5. The transistor arrangement according to claim 1, wherein a distance between the first part and the second part is between 20 nanometers and 60 nanometers.

6. The transistor arrangement according to claim 1, wherein:
the channel material is shaped as a fin extending away from a base, the fin comprising a first portion and a second portion, the first portion being closer to the base than the second portion, and
each of the gate electrode of the first transistor, the gate electrode of the second transistor, and the isolation structure at least partially wraps around the second portion of the fin.

7. The transistor arrangement according to claim 1, wherein:
the channel material is shaped as a wire, and
each of the gate electrode of the first transistor, the gate electrode of the second transistor, and the isolation structure at least partially wraps around the wire.

8. The transistor arrangement according to claim 1, wherein the fixed charge dielectric material is a liner that wraps around the third portion of the channel material.

9. A transistor device, comprising:
a channel material over a substrate;
a first transistor having a source region, a drain region, and a first gate, the first gate provided over a first portion of the channel material;
a second transistor having a source region, a drain region, and a second gate, the second gate provided over a second portion of the channel material; and
an isolation structure over a third portion of the channel material, the third portion being between the first portion and the second portion of the channel material, the isolation structure comprising a fixed charge dielectric material,
wherein:
the fixed charge dielectric material includes a dielectric material having fixed charges,
the fixed charges are positive fixed charges when the first and second transistors are P-type transistors, and
the fixed charges are negative fixed charges when the first and second transistors are N-type transistors.

10. The transistor device according to claim 9, wherein:
the channel material is shaped as a fin extending away from a base, the fin comprising a first portion and a second portion, the first portion being closer to the base than the second portion, and
each of the first gate, the second gate, and the isolation structure wraps around the second portion of the fin.

11. The transistor device according to claim 10, wherein the fixed charge dielectric material is a liner that wraps around the second portion of the fin.

12. The transistor device according to claim 9, wherein:
the channel material is shaped as a wire, and
each of the first gate, the second gate, and the isolation structure wraps around the wire.

13. The transistor device according to claim 12, wherein the fixed charge dielectric material is a liner that wraps around the wire.

14. The transistor device according to claim 9, wherein the fixed charge dielectric material comprises a dielectric material having a concentration of fixed charges greater than $10^{12}$ fixed charges per square centimeter.

15. A method of manufacturing a transistor device, the method comprising:
providing a first gate over a first portion of a channel material;
providing a second gate over a second portion of the channel material;
providing an isolation structure over a third portion of the channel material, the third portion being between the first portion and the second portion of the channel material, the isolation structure comprising a fixed charge dielectric material,
wherein:
the fixed charge dielectric material includes a dielectric material having fixed charges,
the fixed charges are positive fixed charges when the channel material is a P-type material, and
the fixed charges are negative fixed charges when the channel material is an N-type material.

16. The method according to claim 15, wherein providing the isolation structure comprises:
performing chemical vapor deposition (CVD) or atomic layer deposition (ALD) to deposit a dielectric material having a conduction band offset with respect to the channel material of at least 2 electron-volts,
ensuring that, during the deposition, a partial pressure of cation-precursor species in a reaction chamber of the deposition is greater than a partial pressure of cation-precursor species in the reaction chamber, and
providing negatively charged hydrogen atoms to the reaction chamber during the deposition.

17. The method according to claim 16, further comprising annealing the substrate for a time sufficient to drive away at least 80% of the negatively charged hydrogen atoms incorporated in the dielectric material.

18. The method according to claim 16, further comprising patterning the dielectric material to form the isolation structure.

19. The method according to claim 15, wherein providing the channel material comprises providing the channel material shaped as a fin extending away from the substrate or providing the channel material shaped as a wire, and wherein each of the first gate, the second gate, and the isolation structure wraps entirely around the wire.

20. The method according to claim 15, further comprising:
providing a gate dielectric material disposed between the channel material and each of the first gate and the second gate, and
for each of the first and second transistors, providing a source region and a drain region spaced apart by a gate length between 20 and 40 nanometers.

* * * * *